(12) United States Patent
Suzuki

(10) Patent No.: US 8,952,439 B2
(45) Date of Patent: Feb. 10, 2015

(54) NONVOLATILE SEMICONDUCTOR STORAGE DEVICE AND METHOD OF MANUFACTURE THEREOF

(75) Inventor: Ryota Suzuki, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,508

(22) Filed: Sep. 7, 2012

(65) Prior Publication Data

US 2013/0248969 A1 Sep. 26, 2013

(30) Foreign Application Priority Data

Mar. 23, 2012 (JP) .............................. P2012-067402

(51) Int. Cl.
| | | |
|---|---|---|
| *H01L 29/788* | (2006.01) | |
| *H01L 29/76* | (2006.01) | |
| *H01L 29/792* | (2006.01) | |
| *H01L 21/3205* | (2006.01) | |

(52) U.S. Cl.
USPC ............ 257/316; 257/312; 257/324; 438/593

(58) Field of Classification Search
CPC ........................ H01L 29/7881; H01L 29/0676
USPC .......... 257/312, 316, 324, 326, 330; 438/115, 438/264, 593
IPC ..................................................... H01L 29/788
See application file for complete search history.

(56) References Cited

U.S. PATENT DOCUMENTS

| | | | |
|---|---|---|---|
| 7,915,156 B2 | 3/2011 | Aoyama et al. | |
| 8,008,149 B2 | 8/2011 | Kuniya | |
| 2005/0156233 A1* | 7/2005 | Lin ................................ | 257/330 |
| 2006/0046373 A1* | 3/2006 | Ito et al. ........................ | 438/201 |
| 2006/0051920 A1* | 3/2006 | Yamaguchi et al. ........... | 438/257 |
| 2007/0057315 A1* | 3/2007 | Matsui et al. .................. | 257/316 |
| 2007/0184615 A1* | 8/2007 | Brazzelli et al. .............. | 438/266 |
| 2008/0265236 A1* | 10/2008 | Lee et al. ........................... | 257/3 |
| 2008/0283898 A1* | 11/2008 | Kuniya ........................ | 257/316 |
| 2010/0019311 A1* | 1/2010 | Sato et al. ..................... | 257/326 |
| 2011/0309425 A1* | 12/2011 | Purayath et al. .............. | 257/316 |

FOREIGN PATENT DOCUMENTS

JP 2009-117779 5/2009

* cited by examiner

*Primary Examiner* — Long K Tran
*Assistant Examiner* — Dzung Tran
(74) *Attorney, Agent, or Firm* — Patterson & Sheridan, LLP

(57) ABSTRACT

A nonvolatile semiconductor storage device includes a semiconductor substrate on which an element isolation groove is formed, memory cells each including a gate electrode having a charge storage layer, an interelectrode insulating film, and a control electrode, that is formed on the semiconductor substrate via a tunnel insulating film, and an insulating film disposed in the element isolation groove. The interelectrode insulating film is formed to have a first portion above the insulating film that is separated from one of the insulating film and the control electrode by an air gap and a second portion above the charge storage layer that is separated from the charge storage layer by a cavity.

12 Claims, 39 Drawing Sheets

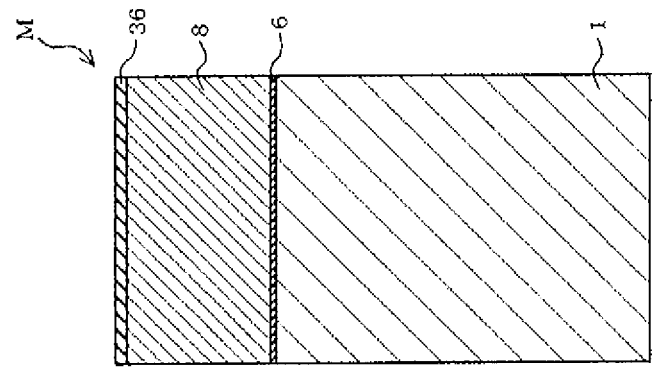
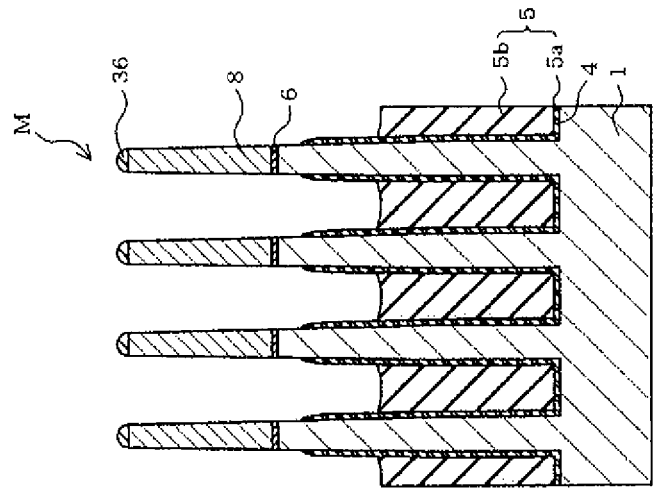

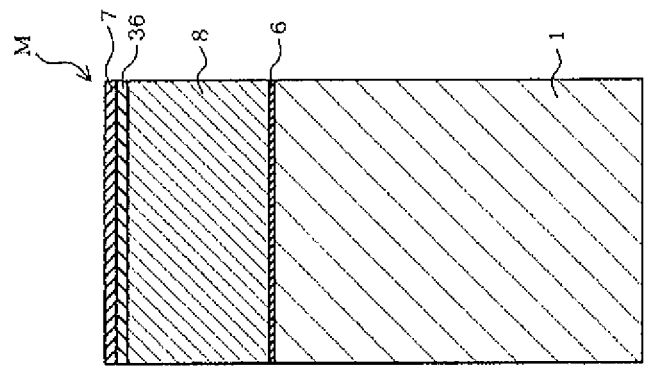
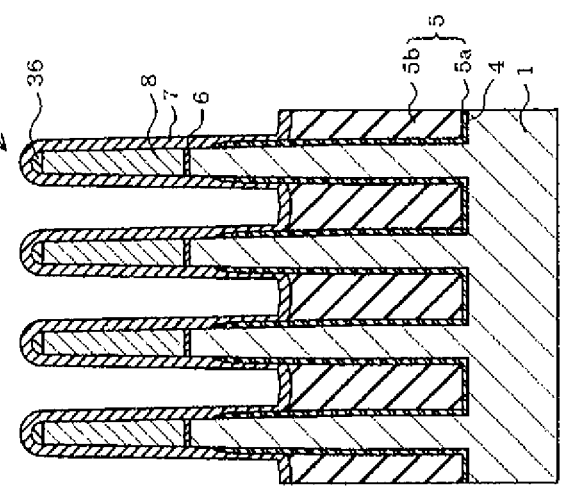

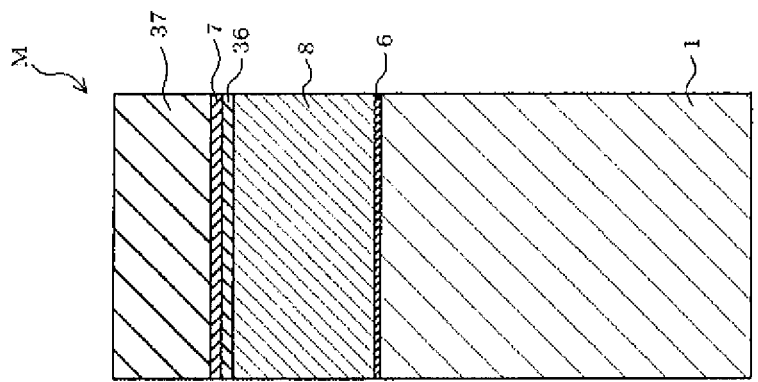
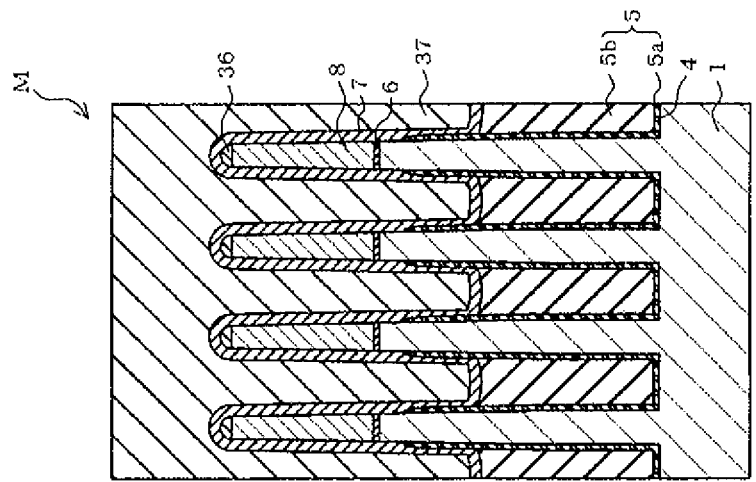

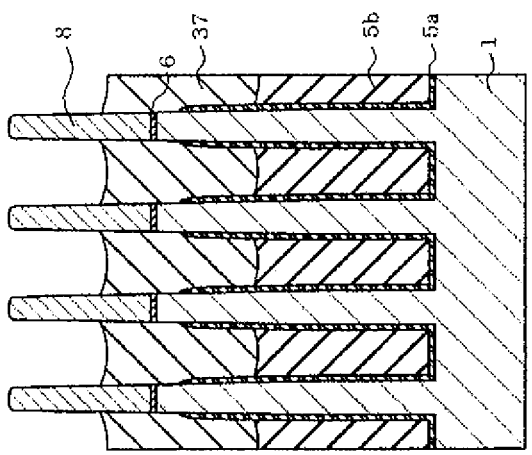
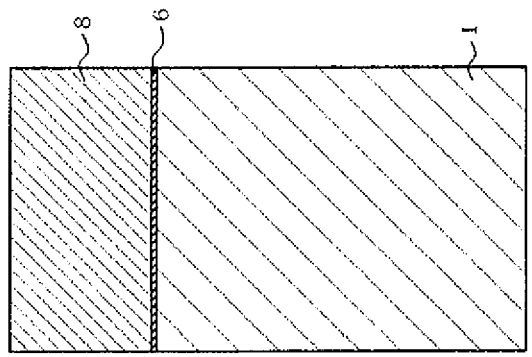

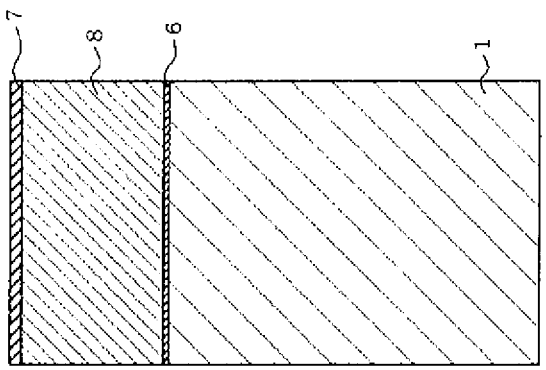
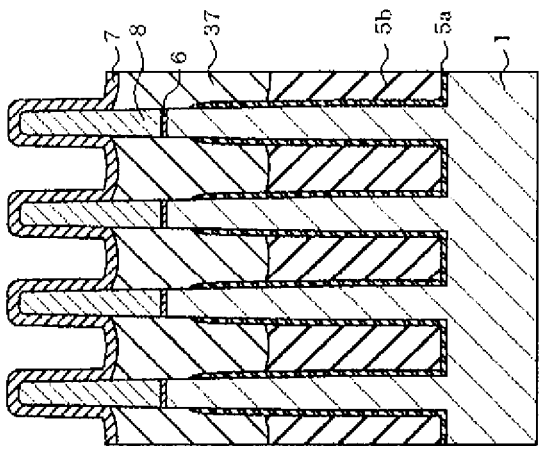

NONVOLATILE SEMICONDUCTOR STORAGE DEVICE AND METHOD OF MANUFACTURE THEREOF

CROSS-REFERENCE TO RELATED APPLICATION

This application is based upon and claims the benefit of priority from Japanese Patent Application No. 2012-067402, filed Mar. 23, 2012; the entire contents of which are incorporated herein by reference.

FIELD

Embodiments described herein relates to a nonvolatile semiconductor storage device and its manufacturing method.

BACKGROUND

A NAND flash memory device that includes memory cells of a floating gate type having a gate electrode structure in which a floating electrode or gate (FG) and a control electrode or gate (CG) are laminated, is known. Recently, with advances in miniaturization and high integration of nonvolatile semiconductor storage devices, the gate length and the gate width of such memory cells have been reduced, so that the effect of capacitive coupling between adjacent memory cells is no longer negligible. As the interference effect between adjacent memory cells rises, there is an increase in the threshold voltage distribution of the memory cells to reduce the reliability of data stored in the memory cells.

Each memory cell of the floating gate type is provided with a floating electrode and a control electrode via a tunnel insulating film on a semiconductor substrate, and an interelectrode insulating film is formed between these electrodes. In addition, an element isolation region is formed between adjacent memory cells, and an element isolating-insulating film is embedded in the element isolation region, obtaining the necessary element characteristic.

A coupling ratio Cr, which is an index of the element characteristic, can be expressed by $Cr=C_{ipd}/(C_{ipd}+C_{ox})$, and this coupling ratio can be improved by increasing the capacitance $C_{ipd}$ between the control electrode and the floating electrode or by decreasing the capacitance $C_{ox}$ between the semiconductor substrate and the floating electrode. At the side of the tunnel insulating film, an element isolating-insulating film is formed, and with the increase in the miniaturization of devices, the electric field through this element isolating-insulating film is no longer negligible, increasing the capacitance $C_{ox}$. If the capacitance $C_{ox}$ increases, the coupling ratio decreases, causing a degrading of the write characteristic.

In addition, when the memory cells are set to a write nonselective state, a selective gate is turned off, setting the channel of the memory cells to a floating state. If the channel of the memory cells is in a floating state, the applied voltage of the control electrode is coupled, raising the channel potential. If the channel potential rises, in principle, the injection of electrons into the floating electrode is suppressed because of the shortage in the potential difference between the floating electrode and the channel. As a result, write processing cannot be implemented.

However, since the width of the element isolation region is reduced with the increase in density of the memory cells, the adjacent interference effect rises to increase the capacitance between the adjacent channels. As a result, if a write selective memory cell is adjacent to a write nonselective memory cell, the channel of the write selective memory cell is capacitively coupled with the channel of the write nonselective memory cell, so that no writing into the write selective memory cell may occur, or wrong writing into the write nonselective memory cell may occur.

DESCRIPTION OF THE DRAWINGS

FIG. 12A is a schematic vertical cross section along A-A line of FIG. 2A during the manufacturing process (No. 4), and FIG. 12B is a schematic vertical cross section along B-B line of FIG. 2A during the manufacturing process (No. 4).

FIG. 14A is a schematic vertical cross section along A-A line of FIG. 2A during the manufacturing process (No. 5), and FIG. 14B is a schematic vertical cross section along B-B line of FIG. 2A during the manufacturing process (No. 5).

FIG. 16A is a schematic vertical cross section along A-A line of FIG. 2A during the manufacturing process (No. 6), and FIG. 16B is a schematic vertical cross section along B-B line of FIG. 2A during the manufacturing process (No. 6).

FIG. 38A is a schematic vertical cross section along A-A line of FIG. 2A during the manufacturing process (No. 16), and FIG. 38B is a schematic vertical cross section along B-B line of FIG. 2A during the manufacturing process (No. 16).

FIG. 39A is a schematic vertical cross section along A-A line of FIG. 2A during the manufacturing process (No. 17), and FIG. 39B is a schematic vertical cross section along B-B line of FIG. 2A during the manufacturing process (No. 17).

DETAILED DESCRIPTION

Figure 1:
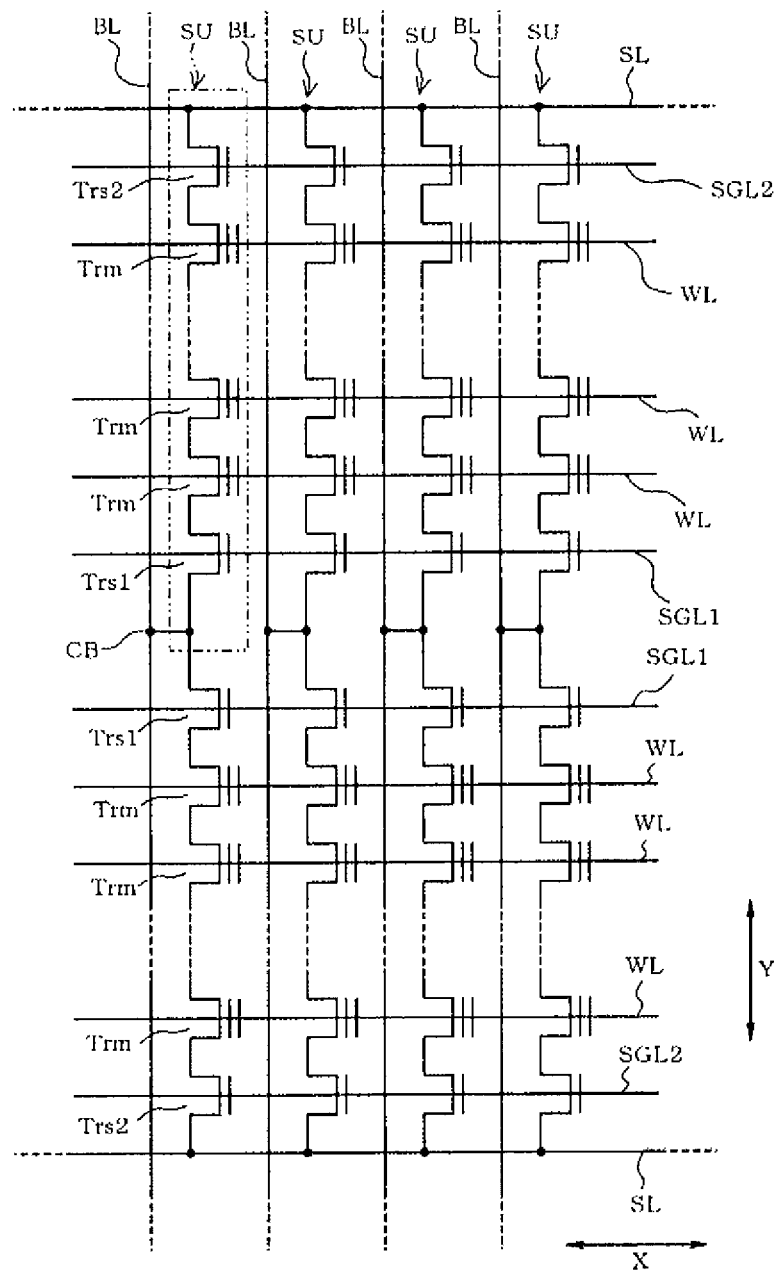
FIG. 1 is a diagram showing part of a memory cell region according to a first embodiment.

In general, one embodiment will be explained in detail.

According to the described embodiment, there is provided a nonvolatile semiconductor storage device, in which the interference effect between element regions of adjacent memory cells can be suppressed while the write characteristic of the memory cells is improved by suppressing the decrease in the coupling ratio, and its manufacturing method.

The nonvolatile semiconductor storage device of one embodiment has the following configuration. The device is provided with a semiconductor substrate on which an element isolation groove is formed. In addition, this device is provided with a memory cell region in which memory cells having a gate electrode are formed on the semiconductor substrate. The gate electrode includes a charge storage layer, an interelectrode insulating film, and a control electrode that is laminated, and is formed on the semiconductor substrate via a tunnel insulating film. Moreover, this device is provided with an insulating film which is embedded in the element isolation groove, and has an upper surface that is formed lower than the upper surface of the semiconductor substrate. The interelectrode insulating film and the control electrode of the gate electrode are formed over the element isolation groove. The interelectrode insulating film is formed with a first portion over the element isolation region such that the first portion and the control electrode or the first portion and the insulating film are separated by an air gap.

The method for manufacturing a nonvolatile semiconductor storage device of one embodiment includes the following manufacturing processes. The method includes a process for forming a tunnel insulating film on a semiconductor substrate. In addition, this method includes a process for forming a charge storage layer on the tunnel insulating film. Moreover, this method includes a process for forming an element isolation groove on the charge storage layer, the tunnel insulating film, and the semiconductor substrate. Furthermore, this method includes a process for disposing an element isolating-insulating film in the element isolation groove. In addition, this method includes a process for forming an interelectrode insulating film on at least part of an upper surface and a side surface of the charge storage layer and on the element isolating-insulating film. Moreover, this method includes a process for forming a control electrode on the interelectrode insulating film. Furthermore, this method includes a process for forming a gate electrode by first etch processing of the control electrode, the interelectrode insulating film, the charge storage layer, and the tunnel insulating film. In addition, this method includes a process for forming an air gap between the control electrode and the element isolating-insulating film by a second etch processing.

Embodiment 1

Next, with references to FIG. 1 to FIG. 27, a first embodiment is described in which the nonvolatile semiconductor storage device is applied to a NAND type flash memory device. Here, in each embodiment, the same reference numbers will be used to refer to essentially identical constituent parts, and duplicate explanation will be omitted. Also, the figures are schematic, and the relationship between the thickness and the planar size, the ratio of the thickness of each layer, etc., are different from actual dimensions. In addition, the vertical and horizontal directions indicate relative directions in the case wherein a circuit formation surface in a semiconductor substrate is in the up state and do not necessarily agree with directions based on the gravitational acceleration direction.

First, the structure of a NAND type flash memory device of this embodiment will be explained. FIG. 1 is an equivalent circuit diagram showing part of a memory cell array formed in a memory cell region M (shown in FIG. 2) in the NAND type flash memory device.

As shown in FIG. 1, a memory cell array of the NAND type flash memory device is provided with NAND cell units SU in a matrix form. This NAND cell unit SU is provided with two selective transistors Trs1 and Trs2 and several (for example, 64 pieces) memory cells Trm connected in series between the selective transistors Trs1 and Trs2. Here, a dummy transistor may also be respectively formed between the selective transistor Trs1 and the memory cell Trm and between the selective transistor Trs2 and the memory cell Trm.

In FIG. 1, the memory cells Trm arranged in the X direction (corresponding to a word line direction) are commonly connected by a word line WL. In addition, the selective transistors Trs1 arranged in the X direction in FIG. 1 are commonly connected by a selective gate line SGL1. Moreover, the selective transistors Trs2 arranged in the X direction in FIG. 1 are commonly connected by a selective gate line SGL2. A bit line contact CB is connected to a drain region of the selective transistor Trs1.

The bit line contact CB is connected to bit lines BL extending in the Y direction (bit line direction) intersecting with X direction in FIG. 1. In addition, a source region of the selective transistor Trs2 of one block is commonly connected to a source line SL.

Figure 2A:
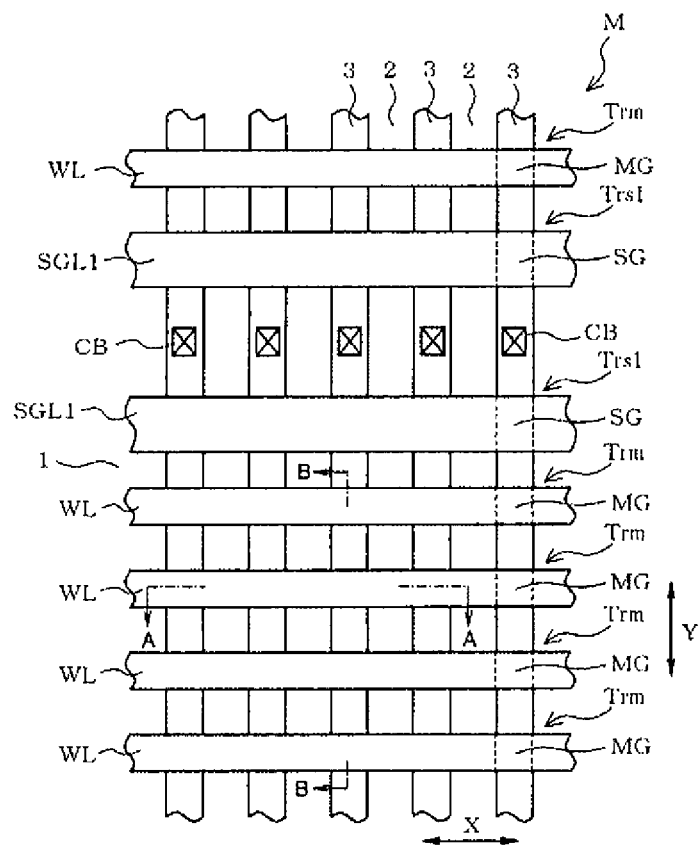
FIG. 2A is a plan view showing a layout pattern of part of the memory cell region.
Figure 2B:
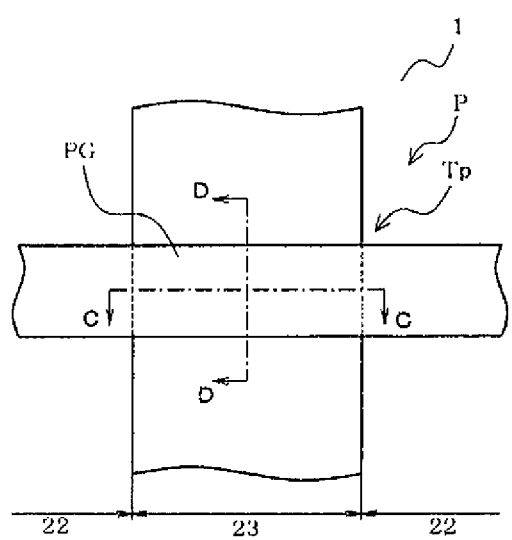
FIG. 2B is plan view showing a layout pattern of part of a peripheral circuit region.

FIG. 2A is a plan view showing a layout pattern of part of a memory cell region M, and FIG. 2B is a plan view showing a layout pattern of part of a peripheral circuit region P. As shown in FIG. 2A, an element isolation region 2 with an STI (shallow trench isolation) structure extends along the Y direction on a semiconductor substrate 1. Several pieces of these element isolation regions 2 are formed at a fixed interval in the X direction, separating element regions 3 in the X direction. The words lines WL for coupling the memory cells Trm extend along the X direction. Several pieces (for example, 64 pieces) of these word lines WL are formed at a fixed interval in the Y direction in FIG. 2A.

In addition, the selective gate lines SGL1 for coupling the selective transistors Trs1 extend along the X direction. The selective gate lines SGL1 are formed on a surrounding area of the bit line contacts CB in the Y direction of FIG. 2A. On the element regions 3 between a pair of selective gate lines SGL1, bit line contacts CB are respectively formed. Here, the selective gate lines SGL2 for coupling the selective transistors Trs2 extend along the X direction as shown in FIG. 1, although they are not shown in FIG. 2A.

As shown in FIG. 2A, gate electrodes MG of the memory cells Trm are formed in the element regions 3 intersecting with the word lines WL. Selective gate electrodes SG of the selective transistors Trs1 are formed on the element regions 3 intersecting with the selective gate lines SGL1. Selective gate electrodes (not shown in the figure) of the selective transistors Trs2 are formed on the element regions 3 intersecting with the selective gate lines SGL2, although they are not shown in FIG. 2A.

In addition, in the peripheral circuit region P shown in FIG. 2B, element isolation regions 22 with an STI structure are formed on the semiconductor substrate 1, and an element region 23 is separated in an island shape by these element isolation regions 22. A gate electrode PG is formed so that it crosses the element region 23. The transistor (peripheral transistor) of the peripheral circuit region P is provided with the gate electrode PG and drain/source regions that are positioned at the sides of the gate electrode PG and formed on the surface layer of the element region 23 of the semiconductor substrate 1. Various transistors for driving the memory cells Trm, such as transistor Tp with a high withstand voltage (peripheral transistor) or a transistor with a low withstand voltage, are formed in the peripheral circuit region P.

Figure 3A:
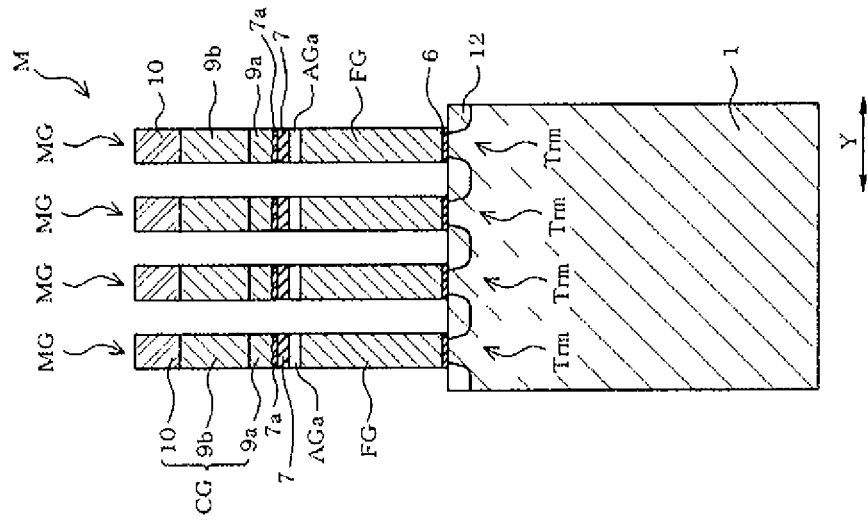
FIG. 3A is a vertical cross section showing the structure of memory cells along A-A line of FIG. 2A.
Figure 3B:
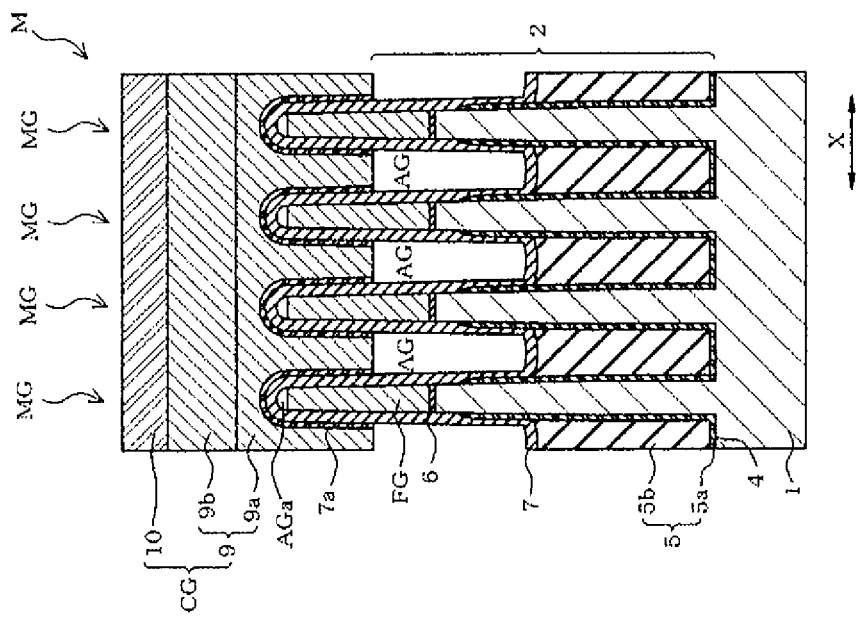
FIG. 3B is a vertical cross section showing the structure of the memory cells along B-B line of FIG. 2A.

Next, the structure of the gate electrodes in the memory cell region M will be explained with reference to FIG. 3A, FIG. 3B, and FIG. 4. FIG. 3A is a vertical cross section showing the structure of memory cells along A-A line of FIG. 2A, and FIG. 3B is a vertical cross section showing the structure of the memory cells along B-B line of FIG. 2A. As shown in FIG. 3A, element isolation grooves 4 are formed on the surface layer of the semiconductor substrate 1. A plurality of these element isolation grooves 4 are formed with a separation in the X direction. Element isolating-insulating films 5 are formed in the element isolation grooves 4.

The element isolating-insulating film 5 includes a liner oxide film 5a formed along the inner surface of the element isolation groove 4 and a spreading type oxide film 5b formed in the inner side of the liner oxide film 5a. The element isolation region 2 is provided with the element isolating-insulating films 5 and air gaps AG on the element isolating-insulating films 5.

This element isolation region 2 electrically isolates each gate electrode MG. The gate electrodes MG are formed via tunnel insulating films 6 on the semiconductor substrate 1, and are provided with floating electrodes FG as charge storage layers and a control electrode CG formed via interelectrode insulating films 7 on the floating electrodes FG.

For example, a silicon oxide film is used as the tunnel insulating film G. In addition, in one embodiment, a polycrystalline silicon layer 8 (see from FIGS. 6A and 6B) doped with impurities such as phosphorus (P) is used as the floating electrode FG. As the interelectrode insulating film 7, in one embodiment, an oxide film/nitride film/oxide film (known in the art as ONO film) is used.

The control electrode CG, in one embodiment, includes a conductive layer provided with polycrystalline silicon layers 9a and 9b doped with impurities such as phosphorus (P) and a silicide layer 10, in which the upper parts of the polycrystalline silicon layers 9a and 9b are converted into a silicide with a metal such as tungsten (W), cobalt (Co), nickel (Ni), etc. A silicide layer may be used in the overall structure of the control electrode CG. This control electrode CG is coupled to the word lines WL shown in FIG. 2A.

The liner oxide films 5a are formed along the inner surface of the element isolation grooves 4 under the surface of the semiconductor substrate 1. These liner oxide films 5a may also be formed along the lower side surfaces of the floating gates FG and the side surfaces of the tunnel insulating films 6. The spreading oxide film 5b is embedded into the liner oxide film 5a, and its upper surface is positioned lower than the lower surface (the upper surface of the semiconductor substrate 1) of the tunnel insulating film 6.

In addition, the interelectrode insulating film 7 is continuously formed on the upper surface and the side surface of the floating electrode FG, the inner surface of the liner oxide film 5a, and the upper surface of the spreading oxide film 5b. The interelectrode insulating film 7 is provided with a nitride film 7a in the part opposite to the floating electrode FG and the control electrode CG. This nitride film 7a is formed in the uppermost part of the interelectrode insulating film 7 so that the upper part of each floating electrode FG is covered. The nitride film 7a is divided between the upper parts of the respective floating electrodes FG.

Moreover, cavities AGa are formed between the interelectrode insulating film 7 and the upper tips of the floating electrodes FG. If the upper tips of the floating electrodes FG are pointed, an electric field may become concentrated on the pointed heads of the tips. For this reason, the cavities AGa are formed as a way to relax the electric field concentration on the pointed heads of the floating electrodes FG.

Furthermore, as shown in FIG. 3B, the memory cells Trm include the gate electrodes MG formed via the tunnel insulating films 6 on the semiconductor substrate 1 and n type impurity diffusion layers 12 formed on the surface layer of the semiconductor substrate 1 at both sides of the gate electrodes MG. The gate electrodes MG of the memory cells Trm are formed parallel to the Y direction. Here, a liner insulating film and an interlayer dielectric film are laminated on the control electrode CG; their detailed explanation is omitted because they are irrelevant to the inventive features of this embodiment.

Figure 4:
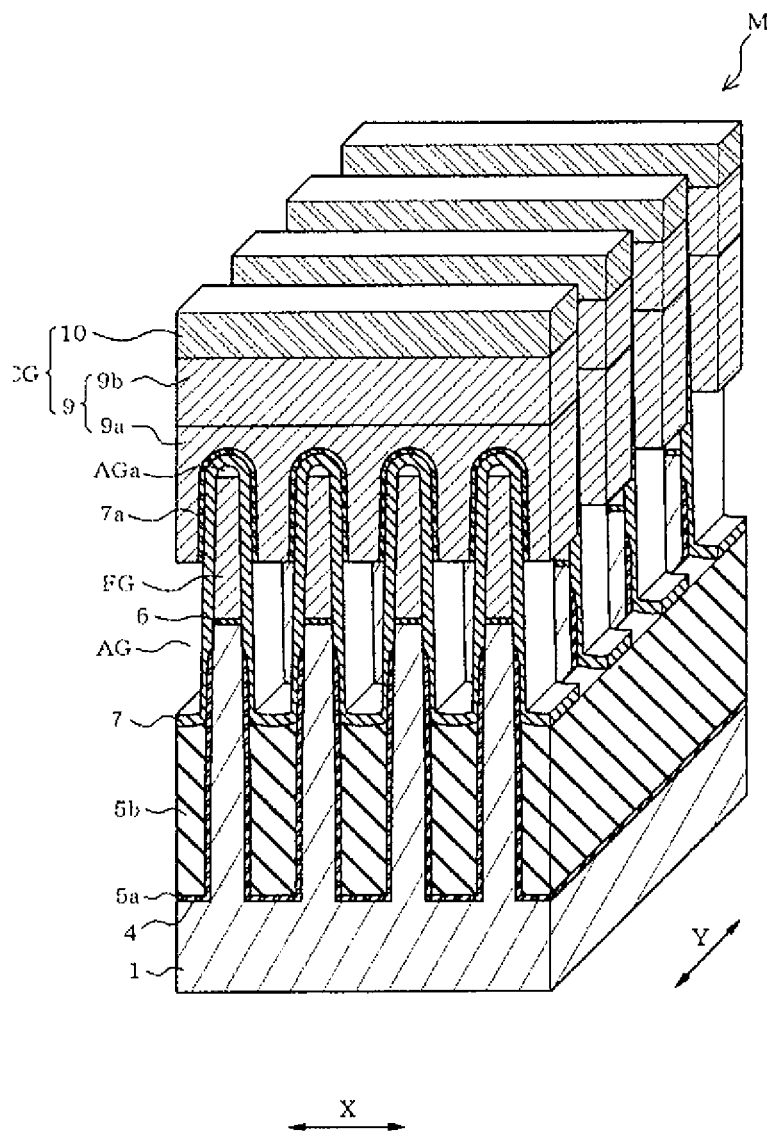
FIG. 4 is a perspective view showing the main part of an air gap formation region.

FIG. 4 is a perspective view showing the main part of an air gap formation region of the memory cell region M. As shown by the perspective view in FIG. 4, the air gaps AG are formed adjacent the side surfaces of the tunnel insulating films 6, the surface layer of the semiconductor substrate 1 directly under the tunnel insulating films 6, and the lower portion of the floating electrodes FG, and extend along the Y direction. The interelectrode insulating film 7 is formed so that the lower side of the air gap AG is covered. The interelectrode insulating film 7 is formed in the Y direction in a plurality of locations as separate insulating films, and each of these insulating films is formed along the Y direction.

Figure 5A:
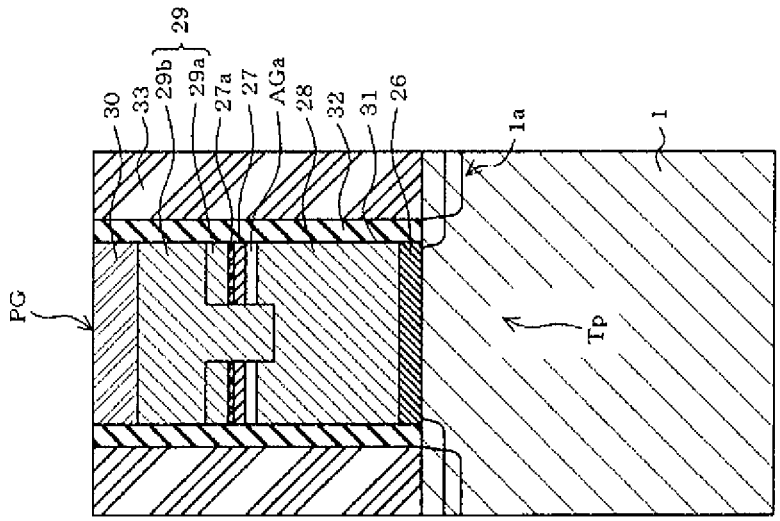
FIG. 5A is a schematic vertical cross section showing a gate electrode structure of the peripheral circuit region along C-C line of FIG. 2B.
Figure 5B:
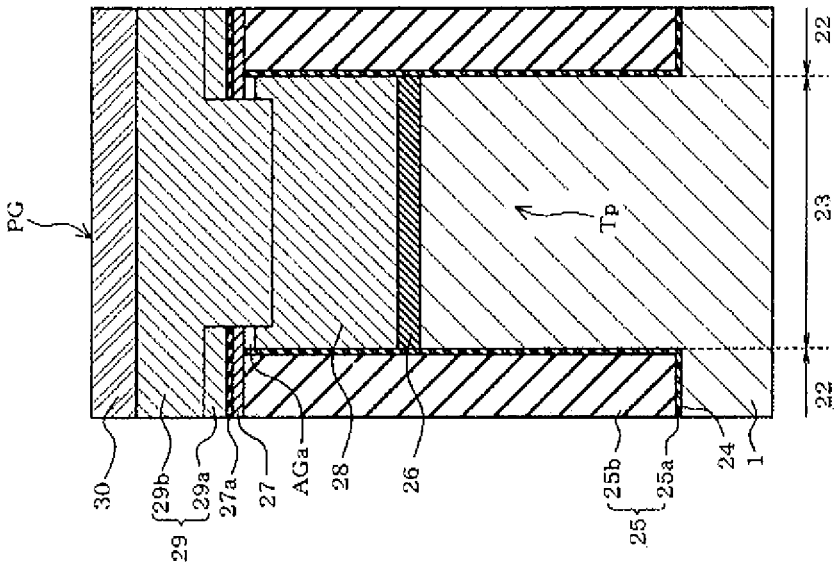
FIG. 5B is a schematic vertical cross section showing the gate electrode structure of the peripheral circuit region along D-D line of FIG. 2B.

Next, the gate electrode structure of a transistor Tp with a high withstand voltage of a peripheral circuit will be explained with reference to FIG. 5A and FIG. 5B. FIG. 5A is a cross section along line C-C in FIG. 2B, and FIG. 5B is a cross section along line D-D in FIG. 2B. As shown in FIG. 5A, the element isolation region 22 with an STI structure is formed on the surface layer of the semiconductor substrate 1.

The element isolation region 22 is divided by an element isolation groove 24 with an aperture width wider than the aperture width of the element isolation groove 4 of the memory cell region M, and an element isolating-insulating film 25 is prepared in the element isolation groove 24. The element isolating-insulating film 25 includes a liner oxide film 25a formed along the inner surface of the element isolation groove 24 and a spreading oxide film 25b formed on the inner side of the liner oxide film 25a.

In the element region 23, there is a gate insulating film 26 for the transistor Tp with a high withstand voltage and a film thickness thicker than the tunnel insulating film 6 of the memory cell Trm. This gate insulating film 26 is the same type of film as the tunnel insulating film 6. For example, a silicon oxide film is used in some embodiments. The gate electrode PG is formed on the gate insulating film 26.

The gate electrode PG is formed on the gate insulating film 26 by laminating polycrystalline silicon layer 28 doped with impurities, interelectrode insulating film 27, polycrystalline silicon layer 29, and silicide layer 30. The element isolating-insulating film 25 is adjacent the lateral sides of the polycrystalline silicon layer 28 and the gate insulating film 26 of the gate electrode PG.

As shown in FIG. 5A and FIG. 5B, an aperture is formed in the interelectrode insulating film 27, and the polycrystalline silicon layers 28 and 29 contact each other via the aperture disposed between them and formed in the interelectrode insulating film 27. The interelectrode insulating film 27 is formed on the upper surface of the side end of the polycrystalline silicon layer 28, and the cavity AGa is formed between the polycrystalline silicon layer 28 and the interelectrode insulating film 27.

In addition, the gate electrode PG is electrically separated by the grooves 31 for electrode separation. At the sidewall of the gate electrode PG, for example, a spacer film 32 containing a silicon oxide film is formed, and a PMD (pre-metal dielectric) film 33 is formed as an interlayer dielectric film at the outside of the spacer film 32.

Next, the method for manufacturing the nonvolatile semiconductor storage device with the above described configuration will be explained with reference to FIG. 6A to FIG. 25B. Here, FIGS. 6A and 6B, 8A and 8B, 10A and 10B, 12A and 12B, 14A and 14B, 16A and 16B, 18A and 18B, 19A and 19B, 21A and 21B, 23A and 23B, and 25A and 25B are schematic vertical cross sections of the memory cell region M.

FIGS. 6A, 8A, 10A, 12A, 14A, 16A, 18A, 19A, 21A, 23A, and 25A are cross sections along line A-A in FIG. 2A. In addition, FIGS. 6B, 8B, 10B, 12B, 14B, 16B, 18B, 19B, 21B, 23B, and 25B are vertical cross sections along line B-B in FIG. 2A. FIGS. 7, 9, 11, 13, 15, 17, 20, 22A, and 24 are vertical cross sections along line C-C in FIG. 2B schematically showing a method for manufacturing the peripheral circuit region P. FIG. 22B is a vertical cross section along line D-D in FIG. 2B.

Figure 6A:
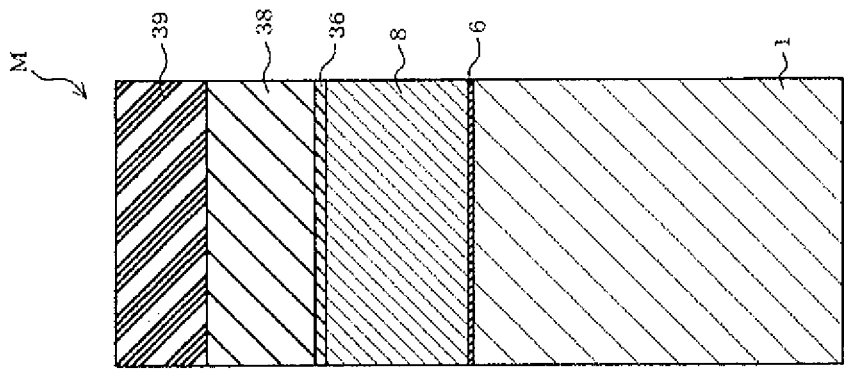
FIG. 6A is a schematic vertical cross section along A-A line of FIG. 2A during the manufacturing process (No. 1)
Figure 6B:
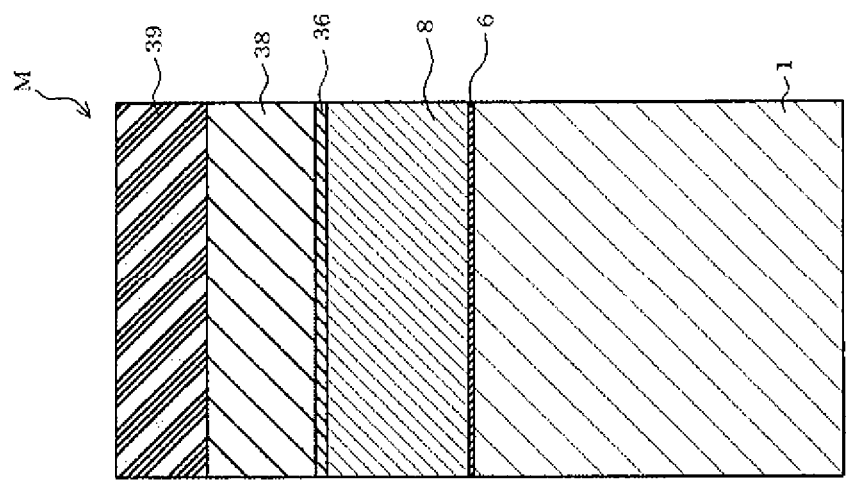
FIG. 6B is a schematic vertical cross section along B-B line of FIG. 2A during the manufacturing process (No. 1).
Figure 7:
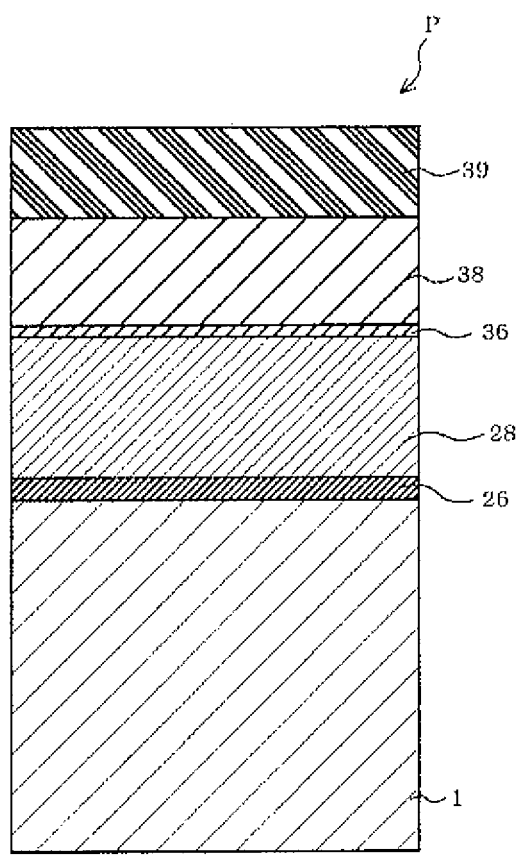
FIG. 7 is a schematic vertical cross section along C-C line of FIG. 2B during the manufacturing process (No. 1).

First, as shown in FIGS. 6A, 6B, and 7, the tunnel insulating film 6 and the gate insulating film 26 are formed on the upper surface of the semiconductor substrate 1 using a thermal oxidation method. Since the tunnel insulating film 6 and the gate insulating film 26 each have a thickness different from each other, a thin oxide film is first formed at a thickness less than the film thickness of the gate insulating film 26 in the area in which the gate insulating film 26 is formed. Next, the entire semiconductor substrate 1 is thermally oxidized, and the tunnel insulating film 6 and the gate insulating film 26, each with different thicknesses, are formed. The film thickness of the tunnel insulating film 6 of the memory cell region M, for example, is about 6 nm, and the film thickness of the gate insulating film 26 of the peripheral circuit region P is thicker than the tunnel insulating film 6 of the memory cell region M.

Next, the polycrystalline silicon layer 8, for forming the floating electrode FG, is deposited at a thickness, for example, of about 100 nm on the tunnel insulating film 6 by the CVD method. At that time, the polycrystalline silicon layer 28 is deposited on the peripheral circuit region P by the same process. Here, for convenience, the memory cell region M and the peripheral circuit region P are divided by using symbols 8 and 28; however these polycrystalline silicon layers 8 and 28 are simultaneously deposited as the same layer.

Next, a sacrificial film 36 for forming the cavity AGa is deposited on the polycrystalline silicon layers 8 and 28. This sacrificial film 36, for example, is formed at a film thickness of 5 nm or smaller. As the sacrificial film 36, any film that has a large selection ratio of etching to the oxide film and the silicon film may be used. For example, a silicon nitride film may be used, or a film that is relatively easily processed and has a large selection ratio may be used, even if it is a film of a metal, etc.

Next, a silicon nitride film 38 is deposited as a mask by the CVD method, and a silicon oxide film 39 is deposited as a hard mask by the CVD method. A photoresist (not shown in the figure) is then spread on the silicon oxide film 39, exposed, and developed to pattern the photoresist.

Figure 8B:
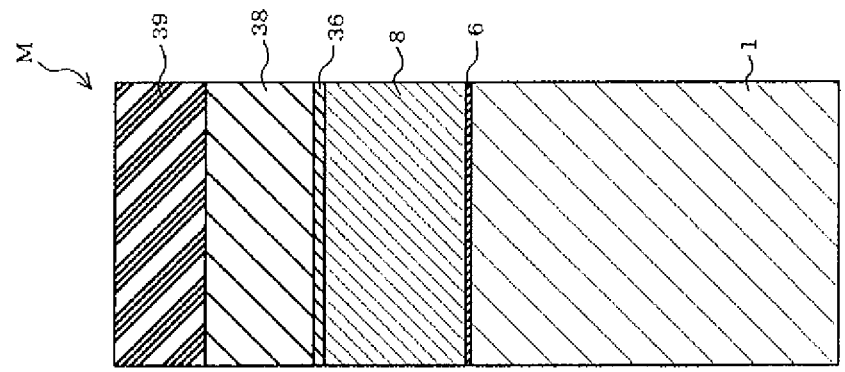
FIG. 8B is a schematic vertical cross section along B-B line of FIG. 2A during the manufacturing process (No. 2).
Figure 8A:
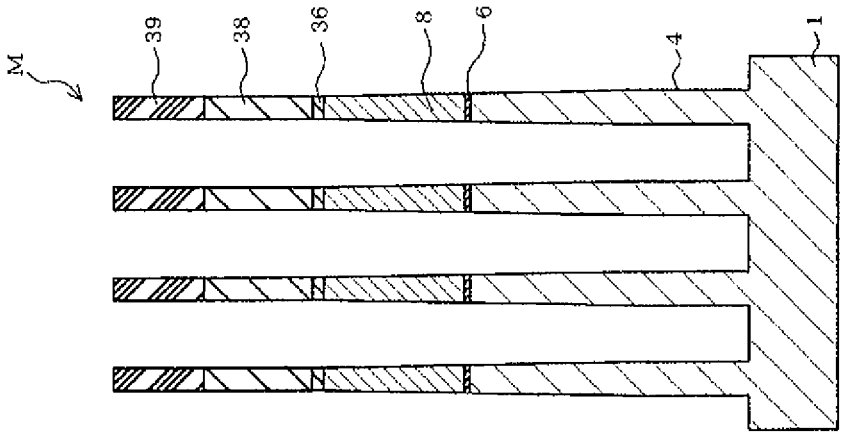
FIG. 8A is a schematic vertical cross section along A-A line of FIG. 2A during the manufacturing process (No. 2)
Figure 9:
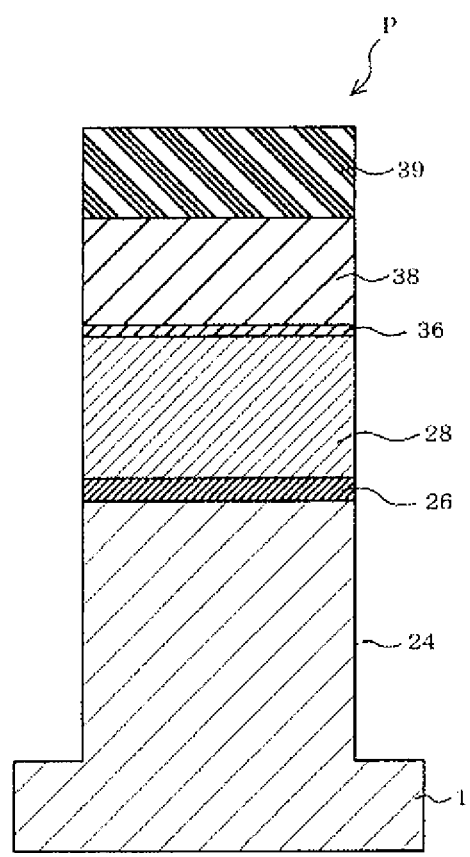
FIG. 9 is a schematic vertical cross section along C-C line of FIG. 2B during the manufacturing process (No. 2).

Next, as shown in FIG. 8A and FIG. 8B and FIG. 9, the silicon oxide film 39 is anisotropically etched by an RIE (reactive ion etching) method using the patterned resist as a mask. After etching, the photoresist is removed, the silicon nitride film 38 is etched by the RIE method using the silicon oxide film 39 as a mask, and the sacrificial film 36, polycrystalline silicon layers 8 and 28, tunnel insulating film 6, gate insulating film 26, and the upper part of the semiconductor substrate 1 are anisotropically etched. Therefore, the element isolation grooves 4 and 24 are simultaneously formed.

Figure 10B:
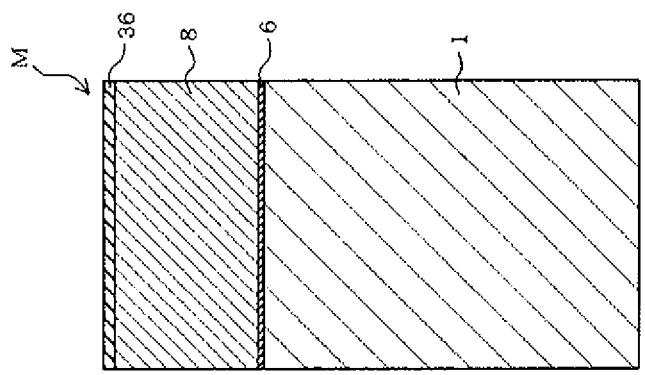
FIG. 10B is a schematic vertical cross section along B-B line of FIG. 2A during the manufacturing process (No. 3).
Figure 10A:
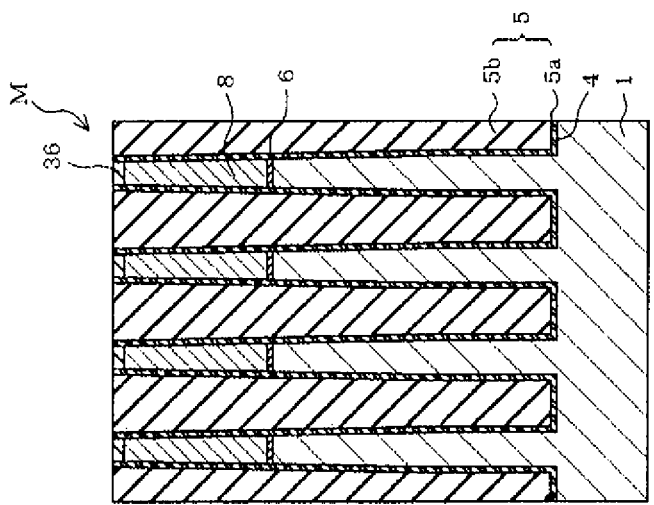
FIG. 10A is a schematic vertical cross section along A-A line of FIG. 2A during the manufacturing process (No. 3)
Figure 11:
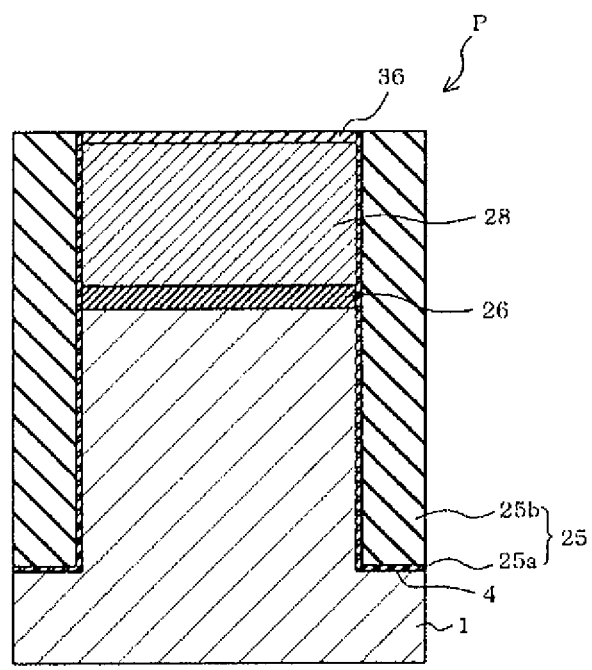
FIG. 11 is a schematic vertical cross section along C-C line of FIG. 2B during the manufacturing process (No. 3).
Figure 13:
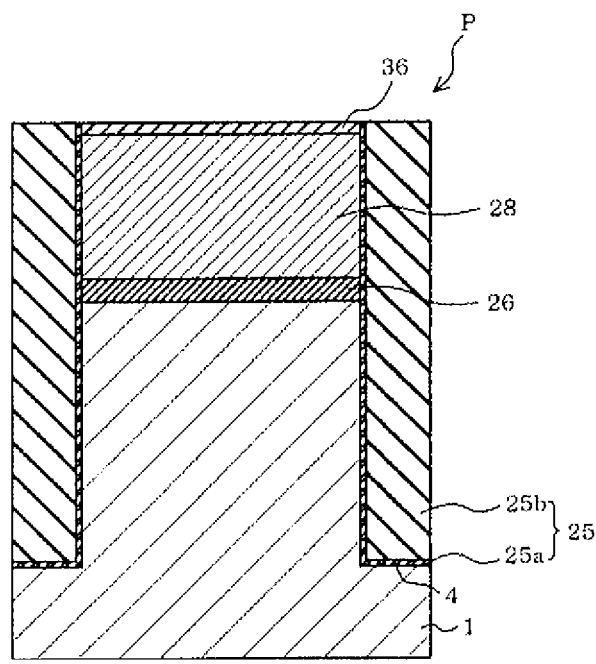
FIG. 13 is a schematic vertical cross section along C-C line of FIG. 2B during the manufacturing process (No. 4).

Next, as shown in FIG. 10A, FIG. 10B, and FIG. 11, the liner oxide film 5a of HTO (high temperature oxide) is formed along the inner surfaces of the element isolation grooves 4 and 24 by the LP-CVD method. A spreading solution (for example, polysiloxane) for insulating is sent to the inside of the liner oxide film 5a by a spreading technique and formed in the element isolation grooves 4 and 24.

Next, using the silicon oxide film 38 as a stopper, the silicon oxide film 39 on the silicon nitride film 38 is removed using the CMP (chemical mechanical polishing) method, leaving spreading oxide films 5b and 25b in the element isolation grooves 4 and 24. The silicon nitride film 38 used as a mask is peeled off, for example, by wet-etching with a chemical etching solution, thereby exposing the upper surface of the sacrificial film 36.

Next, as shown in FIG. 12A and FIG. 12B, the upper part of the element isolating-insulating film 5 in the memory cell region M, for example, is etched back with a hydrofluoric acid solution. At that time, the element isolating-insulating film 5 (especially the spreading oxide film 5b) is etched back down to a level lower than the lower surface of the tunnel insulating film 6. On the other hand, in the peripheral circuit region P, a mask is formed in advance on the sacrificial film 36 and the element isolating-insulating film 25, so that the upper surface of the element isolating-insulating film 25 is not etched (see FIG. 13).

Next, as shown in FIG. 14A and FIG. 14B, the interelectrode insulating film 7 is formed on the entire surface. The areas in which there is an interelectrode insulating film 7 in the memory cell region M are the upper surface of the element isolating-insulating film 5, the upper side surface of the semiconductor substrate 1, the side surface of the tunnel insulating film 6, the side surface of the polycrystalline silicon film 8, and the side surface and the upper surface of the sacrificial film 36. For the interelectrode insulating film 7 that is formed at this time, for example, oxide films and nitride films are repeatedly formed, such ONO and ONONO (as used herein, where O represents an oxide film and N represents a nitride film), and oxide films are formed as the uppermost layer and the lowermost layer.

The reason why the oxide films are formed as the lowermost layer and the uppermost layer is that although the sacrificial film 36 is peeled off in a process which will be mentioned later, the etching selectivity can be raised between the uppermost layer and the lowermost layer of the interelectrode insulating film 7 when a nitride film is used as the sacrificial film 36. In addition, when the interelectrode insulating film 7 is formed, especially when a nitride film (N) is formed, it is desirable not to use a typical CVD method, and the film may be formed by applying plasma nitrification (for example, SPA (slot plane antenna) nitrification). Here, the film may also be formed by the ALD-CVD method.

Figure 15:
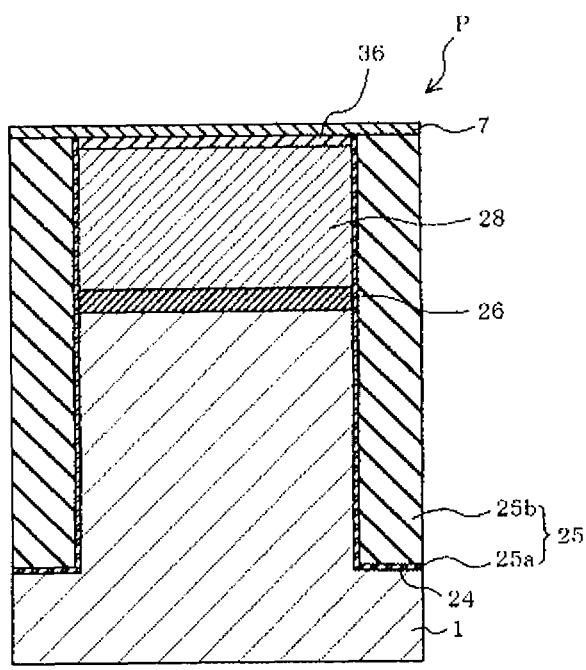
FIG. 15 is a schematic vertical cross section along C-C line of FIG. 2B during the manufacturing process (No. 5).

The reason for this is that since the interelectrode insulating film 7 is also exposed to the etching solution when the sacrificial film 36 is removed by wet-etching, the wet-etching resistance is improved. This is similarly true for the sacrificial film 37, which will be described later. At that time, an oxide film may be used as the lowermost layer, and a nitride film may be formed as its upper layer. In addition, if necessary, oxide films and nitride films may be repeatedly formed, and an oxide film may be formed as the uppermost layer. Therefore, various kinds of laminated film structures such as an O film, ONO film, and ONONO film can be formed. This interelectrode insulating film 7 in the peripheral circuit region P, as shown in FIG. 15, is also formed simultaneously.

In addition, since the interelectrode insulating film 7 is formed along the side surface of the tunnel insulating film 6 and the inner surface of the element isolation groove 4 of the semiconductor substrate 1, the interelectrode insulating film 7 may be formed as a thin film to obtain the desired air gap AG width. Here, even if the interelectrode insulating film 7 is thinned at this manufacturing stage, the film thickness of interelectrode insulating film 7 will be compensated for in a later film formation treatment of the nitride film 7a.

Figure 17:
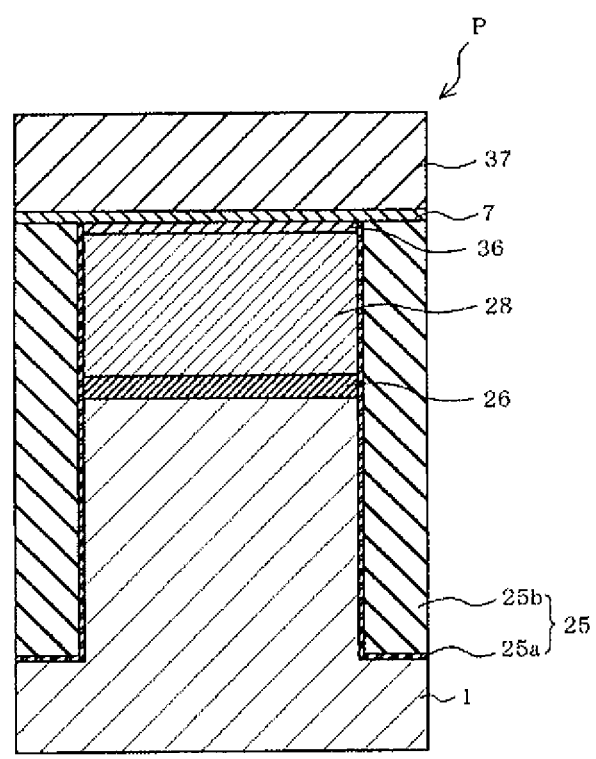
FIG. 17 is a schematic vertical cross section along C-C line of FIG. 2B during the manufacturing process (No. 6).

Next, as shown in FIG. 16A, FIG. 16B, and FIG. 17, the sacrificial film 37 is formed on the interelectrode insulating film 7. As the sacrificial film 37, a film with a high etching selection ratio to the spreading oxide film 5b and the liner oxide film 5a may be used. For example, a silicon nitride film may be used. In addition, as the sacrificial film 37, a film with the same quality as that of the sacrificial film 36 may be used.

Figure 18B:
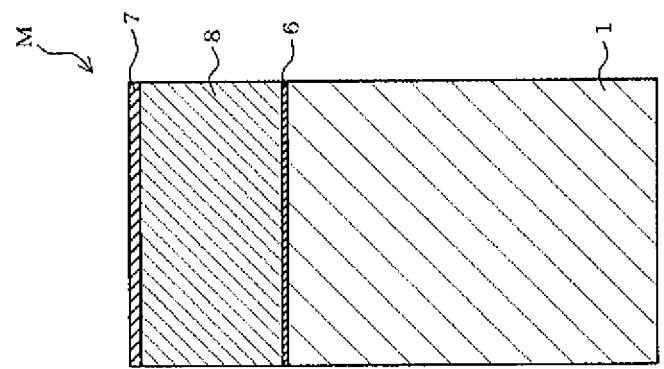
FIG. 18B is a schematic vertical cross section along B-B line of FIG. 2A during the manufacturing process (No. 7).
Figure 18A:
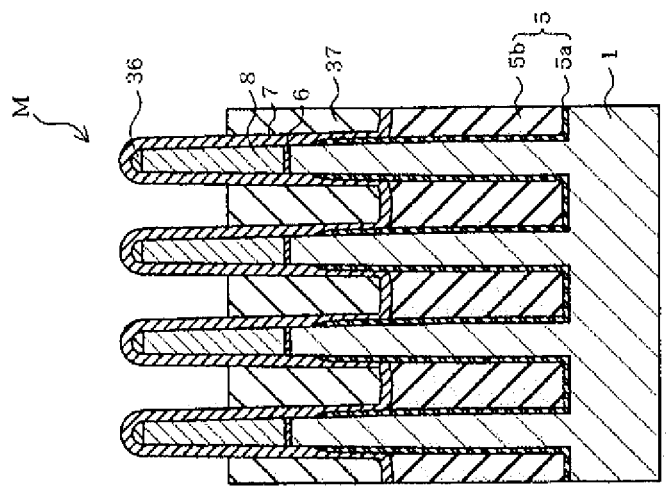
FIG. 18A is a schematic vertical cross section along A-A line of FIG. 2A during the manufacturing process (No. 7)
Figure 19B:
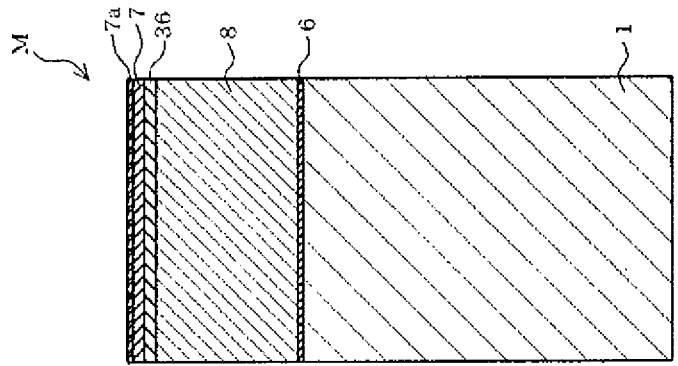
FIG. 19B is a schematic vertical cross section along B-B line of FIG. 2A during the manufacturing process (No. 8).
Figure 19A:
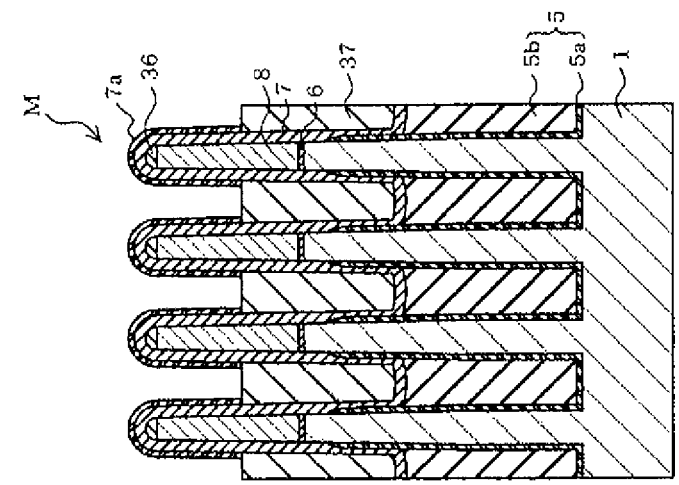
FIG. 19A is a schematic vertical cross section along. A-A line of FIG. 2A during the manufacturing process (No. 8)

Next, as shown in FIG. 18A and FIG. 18B, the sacrificial film 37 is etched back and removed so that the upper surface of the sacrificial film 37 is positioned lower than the apex of the interelectrode insulating film 7. If the sacrificial film 37 is etched back, the film thickness is thinned. In addition, to increase the air gap AG width as described above, the interelectrode insulating film 7 is thinned at this time. For this reason, the nitride film 7a is formed on the top part again to compensate for the film thickness of the interelectrode insulating film 7 (see FIGS. 19A and 19B).

Figure 20:
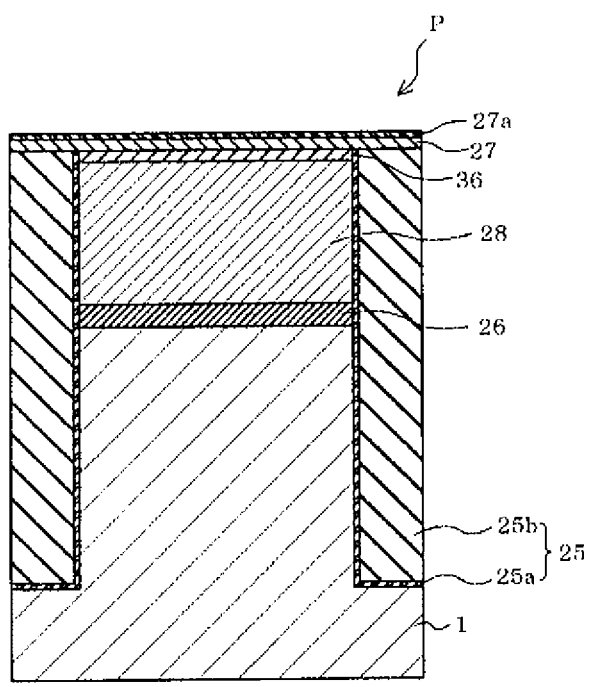
FIG. 20 is a schematic vertical cross section along C-C line of FIG. 2B during the manufacturing process (No. 7).

In the method for forming the nitride film 7a, plasma nitrification may be employed for a reason similar to the one given above. As shown in FIG. 20, the nitride film 27a on the top is similarly formed on the interelectrode insulating film 27 in the peripheral circuit region P, too. Here, for convenience of explanation, symbols 27 and 27a are adopted as shown in FIG. 20, but the interelectrode insulating films 7 and 27 are simultaneously formed, and the nitride films 7a and 27a are also simultaneously formed.

Figure 21B:
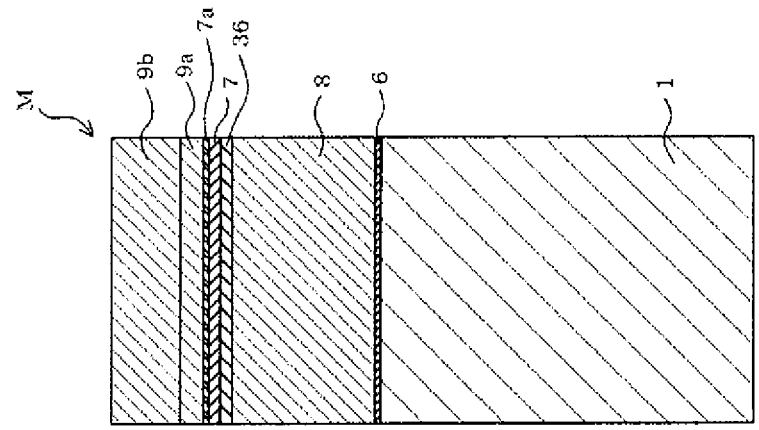
FIG. 21B is a schematic vertical cross section along B-B line of FIG. 2A during the manufacturing process (No. 9).
Figure 21A:
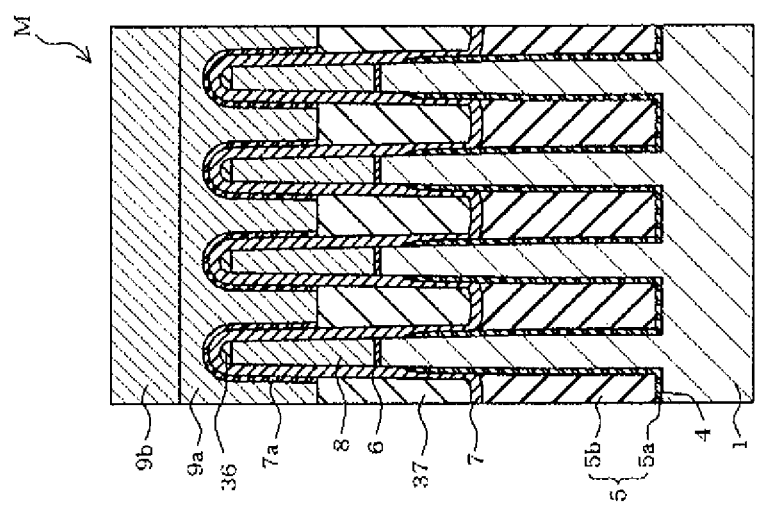
FIG. 21A is a schematic vertical cross section along A-A line of FIG. 2A during the manufacturing process (No. 9)
Figure 22A:
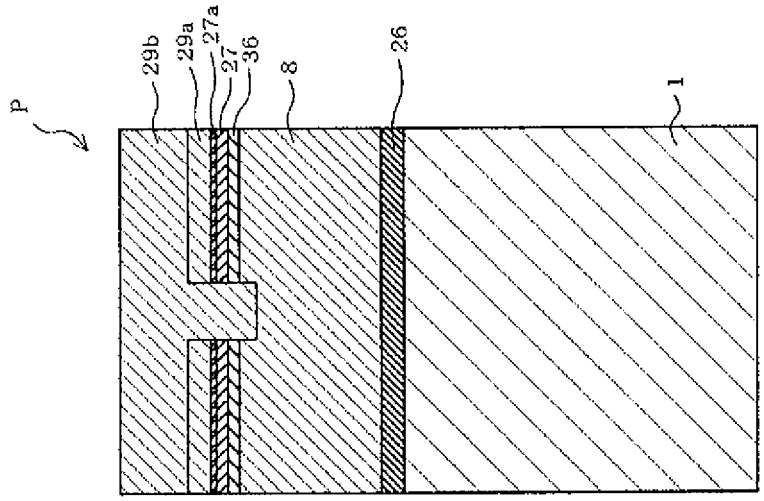
FIG. 22A is a schematic vertical cross section along C-C line of FIG. 2B during the manufacturing process (No. 8)
Figure 22B:
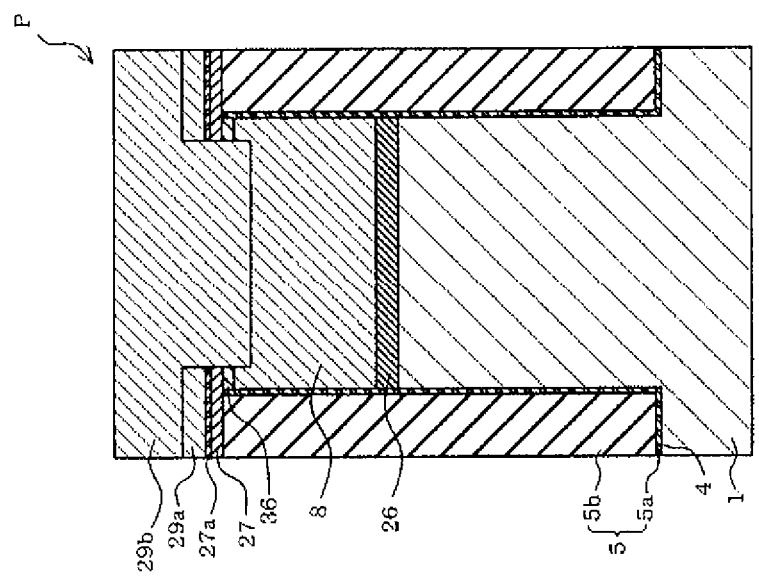
FIG. 22B is a schematic vertical cross section along D-D line of FIG. 2B during the manufacturing process.

Next, as shown in FIG. 21A and FIG. 21B, the polycrystalline silicon layers 9a and 9b, which are doped with impurities, are deposited by the CVD method. In the peripheral circuit region P, the polycrystalline silicon layers 29a and 29b are formed (see FIG. 22A and FIG. 22B), however in this region, the polycrystalline layer 29a is deposited, an aperture is formed in the interelectrode insulating film 7, and the polycrystalline silicon layer 29b is further deposited. With this treatment, the polycrystalline silicon layer 29b makes contact with the polycrystalline silicon layer 8.

Figure 23B:
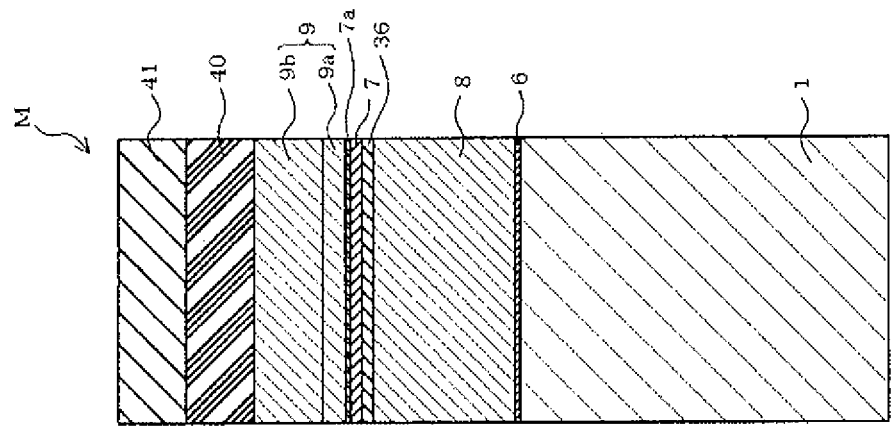
FIG. 23B is a schematic vertical cross section along B-B line of FIG. 2A during the manufacturing process (No. 10).
Figure 23A:
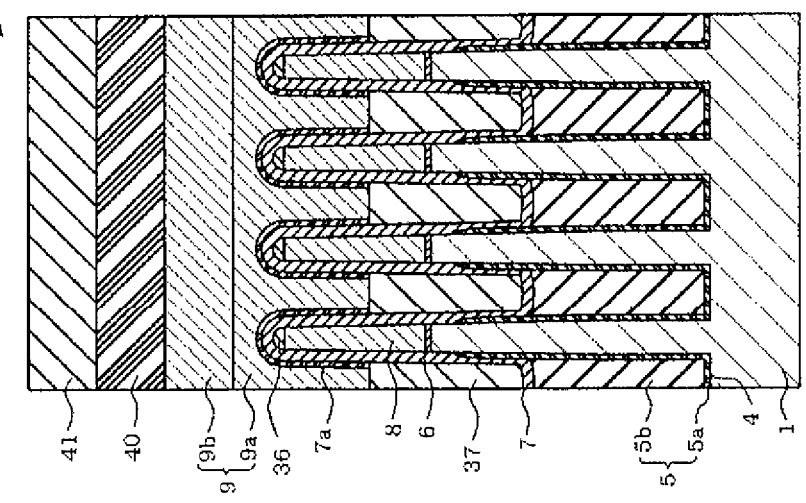
FIG. 23A is a schematic vertical cross section along A-A line of FIG. 2A during the manufacturing process (No. 10)
Figure 24:
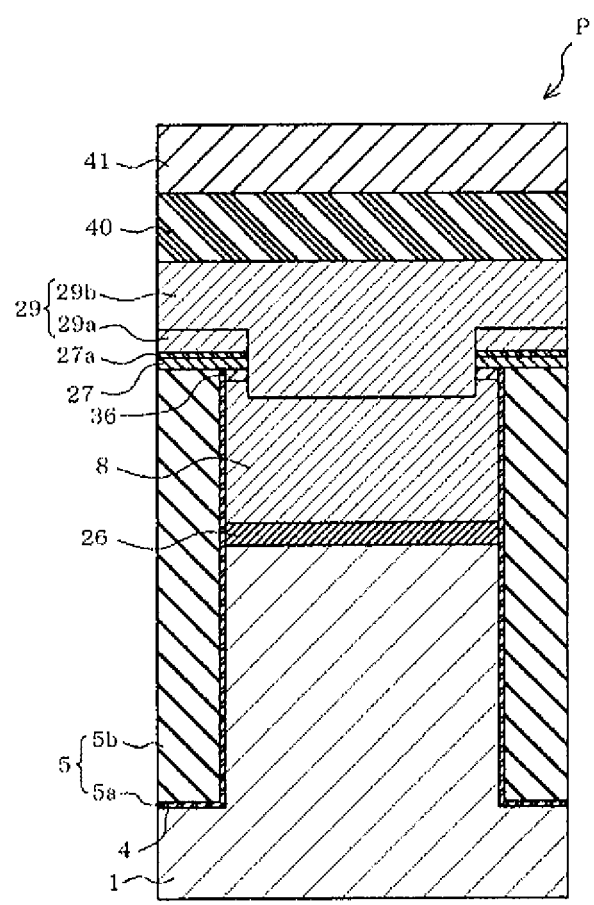
FIG. 24 is a schematic vertical cross section along C-C line of FIG. 2B during the manufacturing process (No. 9).

Next, as shown in FIG. 23A, FIG. 23B, and FIG. 24, a silicon nitride film 40 and a silicon oxide film 41 are laminated as masks for the RIE method on the polycrystalline silicon layers 9b and 29b by the CVD method, for instance.

Figure 25B:
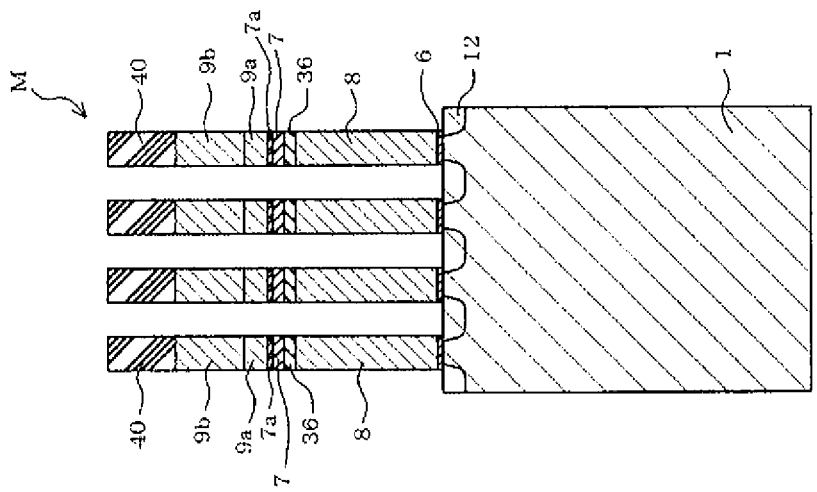
FIG. 25B is a schematic vertical cross section along B-B line of FIG. 2A during the manufacturing process (No. 11).
Figure 25A:
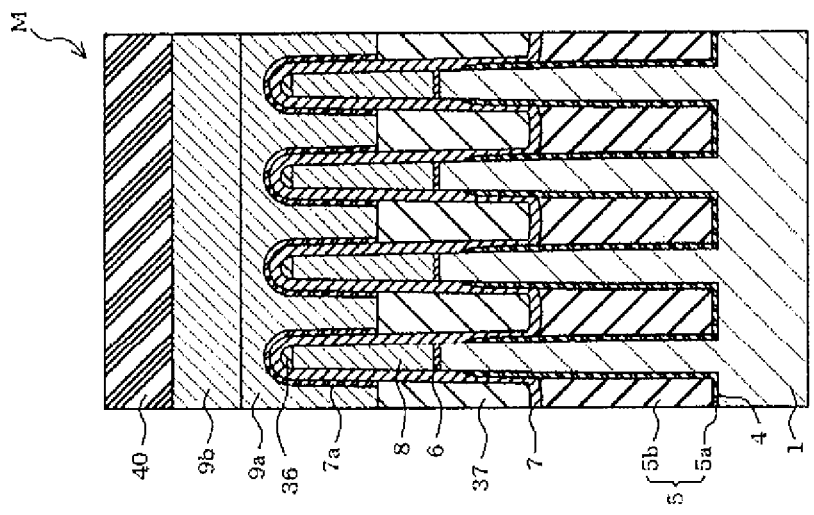
FIG. 25A is a schematic vertical cross section along A-A line of FIG. 2A during the manufacturing process (No. 11)
Figure 26:
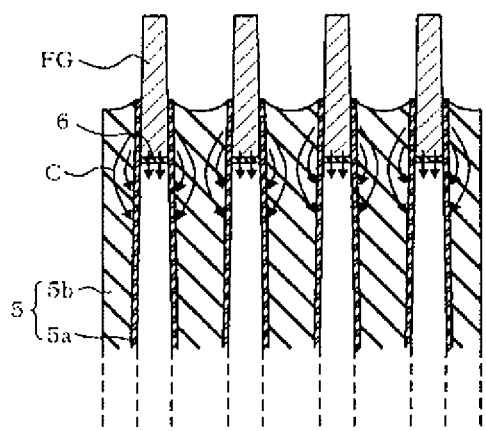
FIG. 26 is an illustrative diagram showing an electric field distribution that is generated in the periphery of a tunnel insulating film.

Next, as shown in FIG. 25A and FIG. 25B, a gate processing treatment is carried out. In this processing treatment, a mask pattern orthogonal to the mask pattern for forming the element isolation groove 4 is formed on the silicon oxide film 41; using this mask pattern as a mask, the silicon oxide film 41 is etched by the RIE method. After an etching treatment, the mask pattern is removed and the silicon nitride film 40 is etched using the silicon oxide film 41 as a mask. Next, using the etched silicon nitride film 40 as a mask, the polycrystalline silicon layer 9, interelectrode insulating film 7, and polycrystalline silicon layer 8 are sequentially etched to form a groove for electrode isolation. Thus, a plurality of gate electrodes MG of the memory cell region M are processed concurrently (see FIG. 25B). Here, the gate electrodes PG of the peripheral circuit region P are also isolated in this process.

If this gate processing treatment is applied, the side surface of the sacrificial film 36 between the upper surface of the polycrystalline silicon layer 8 of the memory cell region M and the interelectrode insulating film 7 is exposed. In addition, at least part of the side surface of the sacrificial film 37 formed at the side of the polycrystalline silicon layer 8 is exposed.

Next, these sacrificial films 36 and 37 are removed by wet-etching. For example, when silicon nitride films are used as the sacrificial films 36 and 37, they are removed with phosphoric acid ($H_3PO_4$) at a high temperature. Therefore, the cavity AGa can be formed on the upper surface of the polycrystalline silicon layer 8, thus being able to form the air gap AG at the side of the polycrystalline silicon layer 8. After the gate processing, since sacrificial films 36 and 37 are removed, the side surface of the interelectrode insulating film 7 is exposed at the time of this removal. Therefore, the nitride film formed as the interelectrode insulating film 7 is exposed to the etching solution, causing a concern that the nitride film will be eroded; however, if this nitride film is formed by the plasma nitrification treatment as described above, the wet-etching resistance can be improved, thus allowing the nitride film to be remain at the desired film thickness.

In addition, for example, if polysiloxane is embedded as an insulating film into the bottom of the element isolation grooves 4 and 24, when the silicon nitride film formed as the sacrificial film 36 is removed, a sufficient etching selection ratio can be obtained, thus being able to cleanly peel off the sacrificial film 36 without concern for the etching treatment time.

Since the following processes may adopt well-known techniques, their detailed explanation is omitted; however, a protective film (not shown in the figure) is formed along the sidewall of each gate electrode MG and PG by the CVD method. Using the ion implantation method and the thermal annealing method, the impurity diffusion layer (see FIGS. 25A and 25B and FIG. 3B) as a source/drain region is formed, a silicide layer of a metal is formed in the upper part of the polycrystalline silicon layer 9b, a liner insulating film and an interlayer dielectric film are formed, and contact CB, etc., are formed. In this manner, the memory cells Trm and the transistor Tp with a high withstand voltage of the peripheral circuit region P can be formed.

The write control method of the memory cell Trm obtained in this manner will be explained. The memory cell Trm stores data in a nonvolatile manner in accordance with the charge storage state of the floating electrode FG. For example, a high state of the threshold voltage, at which electrons are injected into the floating electrode FG, for example, sets a data value to "0," and a low state of the threshold voltage, at which electrons of the floating electrode FG are discharged to the channel, sets a data value to "1," to thereby store binary data. Recently, a multi-valued memory such as a four-value memory has also been produced by more finely dividing the threshold voltage distribution of the memory cells Trm, but for simplicity of explanation, a binary data memory will be explained.

To write "0" into the memory cell Trm, a peripheral circuit (not shown in the figure) applies 0 V to the p well and the bit line BL of the semiconductor substrate 1 applies Vcg1 (>0) to the control electrode CG of the cell for writing, and applies Vcg2 (<Vcg1) to the control electrode CG of other cells for non-writing. At that time, a potential of 0 V of the bit line BL is transferred to the channel. In accordance with the potential difference between the floating electrode FG of the cell for writing and the channel of the surface layer of the semiconductor substrate 1, a tunnel current flows to the tunnel insulating film 6.

Therefore, electrons are injected into the floating electrode FG, and "0" data is written into the cell for writing. To improve the write characteristic of the memory cell Trm, it is desirable to increase the effect of the applied voltage of the control electrode CG to the floating electrode FG. As an index indicating this influence, there is an index called a coupling ratio (Cr).

If the capacitance between the control electrode CG and the floating electrode FG via the interelectrode insulating film 7 is assumed as Cipd and the tunnel capacitance between the floating electrode FG and the channel of the semiconductor substrate 1 via the tunnel insulating film 6 is assumed as Cox, the coupling ratio can be expressed by $Cr=Cipd/(Cipd+Cox)$. If this expression is applied, it is understood that the capacitance Cipd may be increased or the tunnel capacitance Cox may be decreased to increase the coupling ratio Cr.

In particular, in the memory cell Trm, if an insulating film is embedded into the side of the tunnel insulating film 6, a capacitance component C (see FIG. 26), which is generated at the side of the tunnel insulating film 6, is added to the tunnel capacitance Cox, decreasing the coupling ratio Cr. Therefore, if the air gap AG is formed in the element isolation region 2 at the side of the tunnel insulating film 6, the tunnel capacitance Cox can be decreased. Thereby, the write characteristic can be improved.

On the other hand, when writing is prohibited ("1" write) by not selecting the NAND cell unit SU, the potential of the bit line BL is set to Vdd potential, the selective transistor Trs2 at the source line SL is turned off, and the channel of the write nonselective cell unit SU is set to a floating state. By setting the channel to the floating state, even if the control potential Vcg1 and Vcg2 are applied to the control electrode CG, the channel potential Vch is raised by coupling, and the electron injection into the floating electrode FG is suppressed. At that time, it is desirable to efficiently raise the channel potential Vch.

Figure 27:
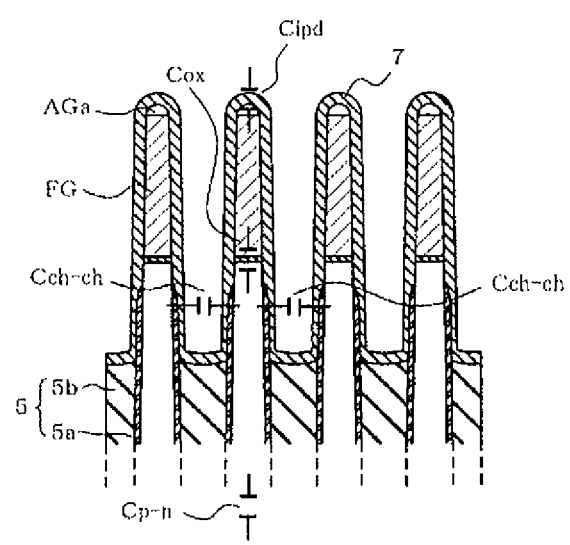
FIG. 27 is an illustrative diagram showing a capacitance component that is generated in a channel of the memory cells.

The capacitance component, which is generated in the vicinity of the channel of the memory cell Trm, is determined mainly by capacitance Cipd, tunnel capacitance Cox, capacitance Cch-ch between the adjacent channels, depletion layer capacitance Cp-n generated in the semiconductor substrate 1, etc., as shown in FIG. 27. To improve the degree of integration of the memory cell Trm, the gap between the channels of the memory cell Trm may be reduced; however, at that time, the capacitance Cch-ch between the adjacent channels is increased.

When writing, the channel of the write selective cell unit SU becomes the potential (~0 V) of the bit line BL, so that the channel of the write nonselective cell unit SU is affected by the potential Vdd (>0) of the bit line BL, thereby raising the potential to higher than 0 V.

If the capacitance Vch-ch between the adjacent channels increases, the channel potential Vch of the write nonselective unit SU is affected by the potential (Vch=~0V) of the channel of the write nonselective cell unit SU, making it difficult for the channel potential to rise. Therefore, if the air gap AG is formed in the element isolation region 2 at the side of the tunnel insulating film 6, the capacitance Cch-ch between the adjacent channels can be decreased. Therefore, it is difficult for the channel potential Vch of the write nonselective cell unit SU to be affected by the channel potential Vch of the write selective cell unit SU, thus being able to efficiently raise the channel potential Vch of the write nonselective cell unit SU.

According to this embodiment, since the air gaps AG are formed in the element isolation region 2 (the upper part of the semiconductor substrate 1) at the side right under the tunnel insulating film 6, the capacitance Cch-ch between the adjacent channels can be decreased, thus lowering the interference effect between adjacent memory cells. Therefore, the decrease of the coupling ratio is suppressed, so that the degradation of the write characteristic of the memory cells Trm can be suppressed.

In addition, since the interelectrode insulating film 7 is positioned lower than the upper surface of the semiconductor substrate 1 and is formed adjacent to the upper surface of the element isolating-insulating film 5, the charge movement distance can be attained through the interelectrode insulating film 7 between the adjacent floating electrodes FG, thus suppressing leak current between the adjacent floating electrodes FG.

Moreover, since the cavity AGa is formed between the upper surface of the floating electrode FG and the interelectrode insulating film 7, the distance between the floating electrode FG and the control electrode CG can be selected so that even if the tip of the floating electrode FG has a pointed shape, the electric field concentration can be relaxed. Therefore, the leak current can be reduced, thereby improving the write characteristic of the memory cells Trm.

Furthermore, even if the interelectrode insulating film 7 is reduced when the sacrificial film 37 is etched back, since the nitride film 7a is formed on the upper surface of the interelectrode insulating film 7, characteristic of the interelectrode insulating film 7 can be compensated for by the nitride film 7a.

In addition, in the peripheral circuit region P, an air gap corresponding to the air gap AG of the memory cell region M is not formed at the side right under the gate insulating film 26. The reason for this is that delamination of the polycrystalline silicon layer 29, shown in FIG. 5A, is prevented. In other words, if an etch back treatment of the element isolating-insulating film 5 for forming the cavity AGa is carried out without masking the peripheral circuit region P, the upper surface of the element isolating-insulating film 25 is also etched back. Therefore, after the upper surface of the element isolating-insulating film 25 is lowered, since the polycrystalline silicon layer 29 is deposited, there is a concern that (delamination) can occur. In this embodiment, since no air gap AG is formed at the side right under the gate insulating film 26 of the peripheral circuit region P, such peeling or delamination can be prevented.

Moreover, after the upper surface height of the element isolating-insulating film 25 is lowered, if impurities (for example, phosphorus (P) and arsenic (As)) for diffusion layer formation are ion-implanted, punch through in the peripheral circuit region P may occur, causing a concern that the withstand voltage as a result becomes degraded. Therefore, it is favorable to not etch back the upper surface of the element isolating-insulating film 25 of the peripheral circuit region P, so that it is favorable not to adopt a process for forming air gaps in the peripheral circuit region P.

Embodiment 2

Figure 28A:
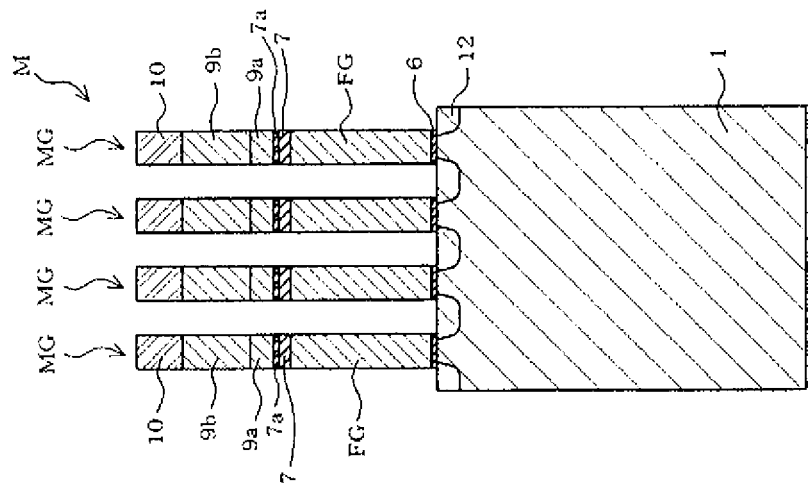
FIGS. 28A and 28B are vertical cross sections showing the main parts in a memory cell region of a second embodiment (FIG. 28A is a diagram corresponding to FIG. 3A, and FIG. 28B is a diagram corresponding to FIG. 3B).
Figure 28B:
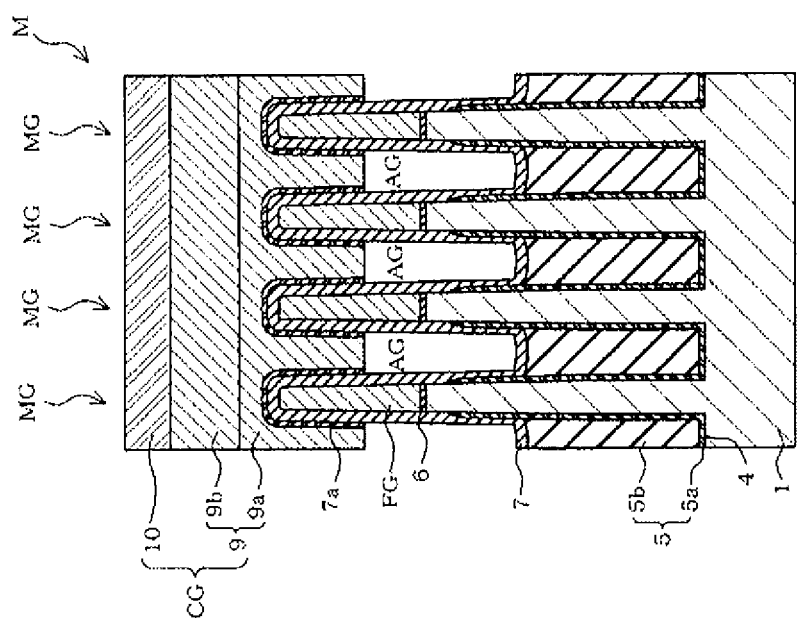
Figure 29:
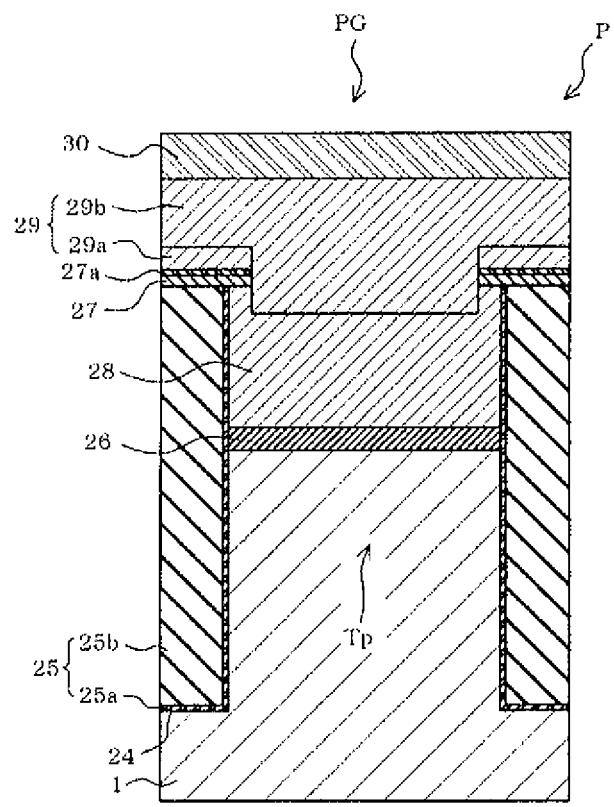
FIG. 29 is a vertical cross section showing the main parts in a peripheral circuit region (a diagram corresponding to FIG. 5A).

FIG. 28A to FIG. 35B show a second embodiment. The same symbols will be given to constitutions having the same function as those of the first embodiment, and their explanation will be omitted. In the second embodiment, as shown in FIG. 28A, FIG. 28B and FIG. 29, the cavities AGa of the memory cell region M and the peripheral circuit region P are not formed. Except for this structure, the structure of this embodiment is the same as the structure of the first embodiment. In the explanation of this embodiment, the structure and the manufacturing method of the memory cell region M will mainly be explained.

Figure 30B:
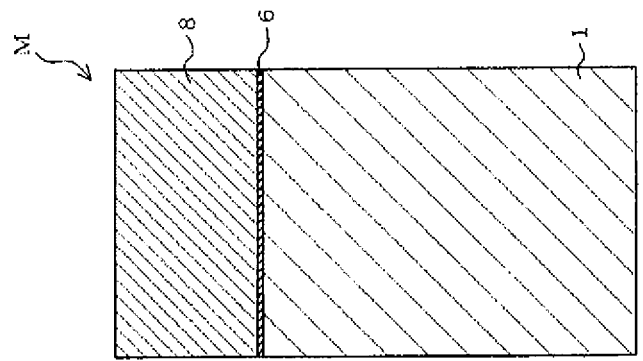
FIG. 30B is a schematic vertical cross section along B-B line of FIG. 2A during the manufacturing process (No. 12).
Figure 30A:
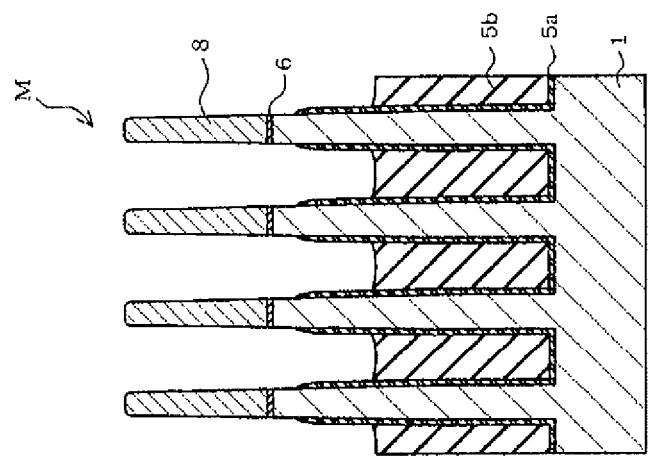
FIG. 30A is a schematic vertical cross section along A-A line of FIG. 2A during the manufacturing process (No. 12)
Figure 31:
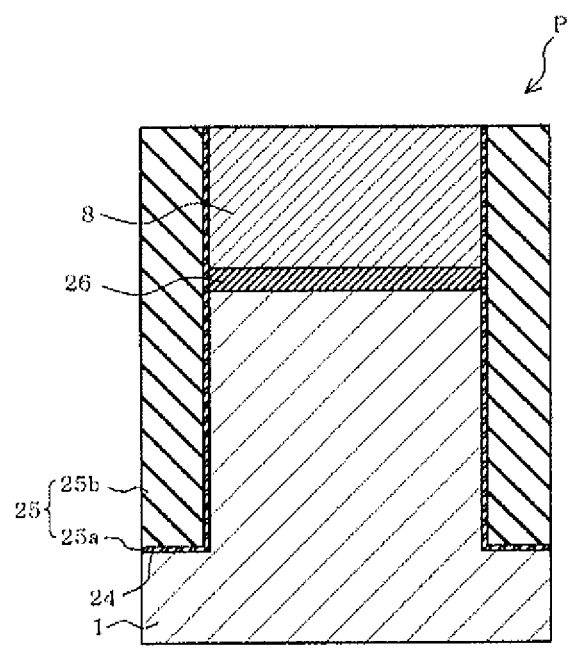
FIG. 31 is a schematic vertical cross section along C-C line of FIG. 2B during the manufacturing process (No. 10).
Figure 32B:
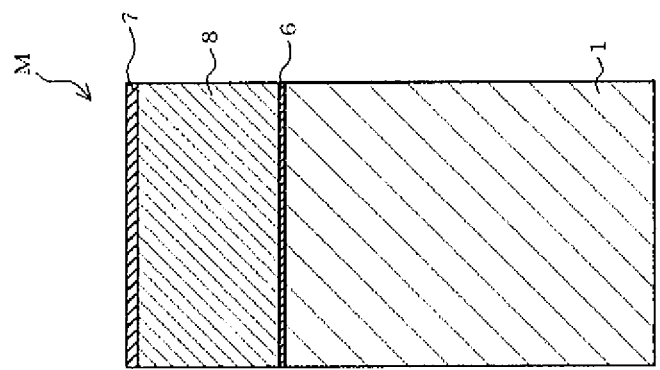
FIG. 32B is a schematic vertical cross section along B-B line of FIG. 2A during the manufacturing process (No. 13).
Figure 32A:
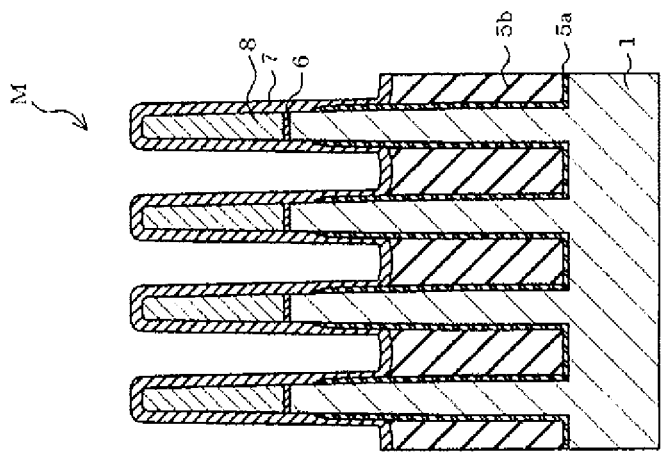
FIG. 32A is a schematic vertical cross section along A-A line of FIG. 2A during the manufacturing process (No. 13)
Figure 33B:
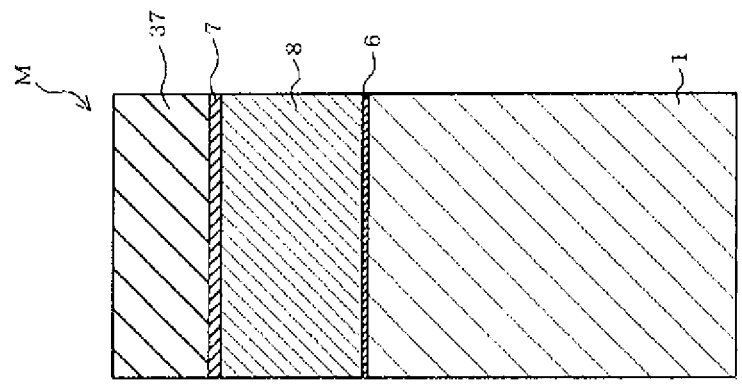
FIG. 33B is a schematic vertical cross section along B-B line of FIG. 2A during the manufacturing process (No. 14).
Figure 33A:
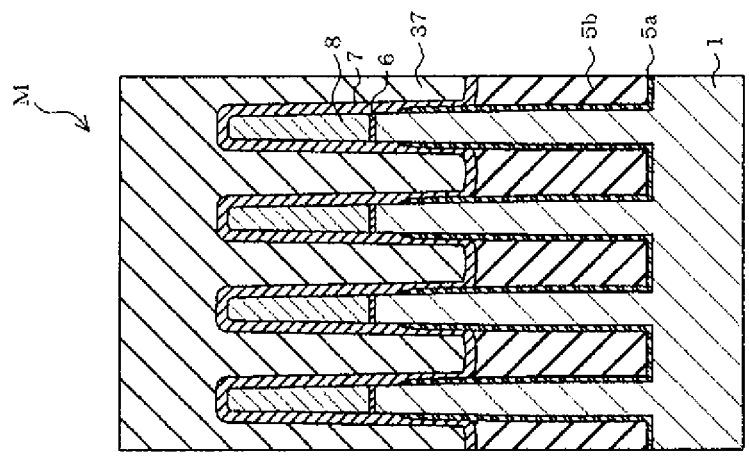
FIG. 33A is a schematic vertical cross section along A-A line of FIG. 2A during the manufacturing process (No. 14)
Figure 34B:
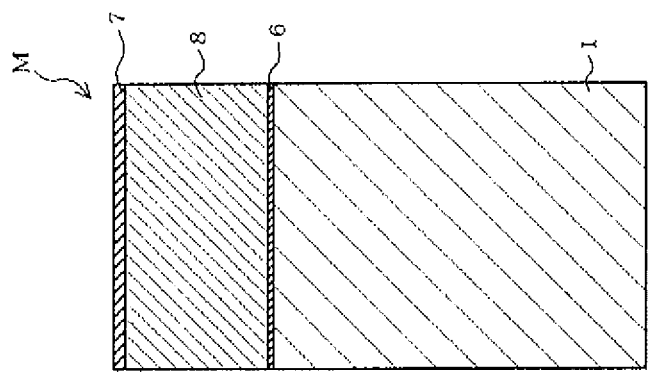
FIG. 34B is a schematic vertical cross section along B-B line of FIG. 2A during the manufacturing process (No. 15).
Figure 34A:
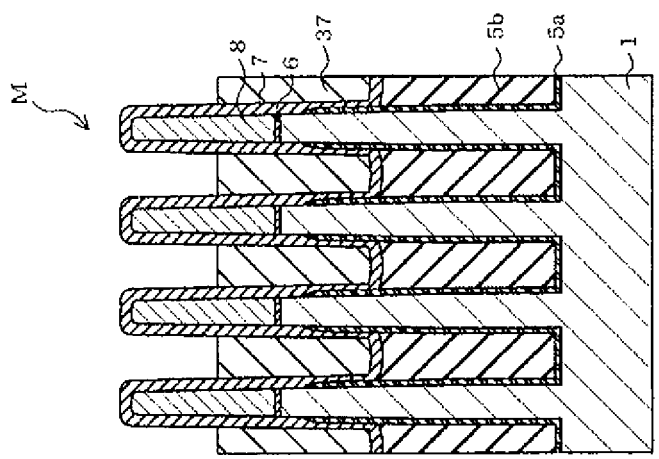
FIG. 34A is a schematic vertical cross section along A-A line of FIG. 2A during the manufacturing process (No. 15)
Figure 35A:
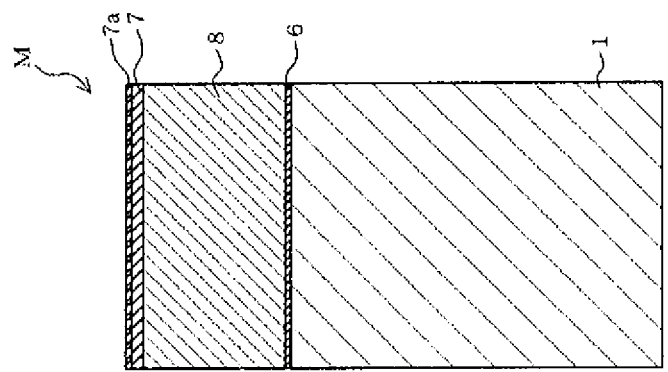
FIG. 35A is a schematic vertical cross section along A-A line of FIG. 2A during the manufacturing process (No. 16)
Figure 35B:
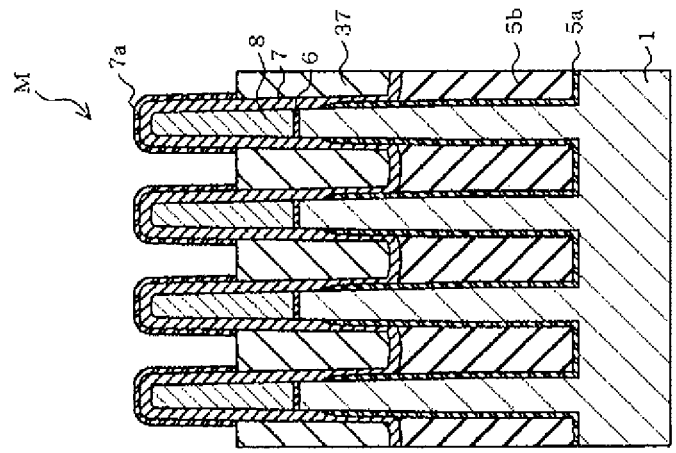
FIG. 35B is a schematic vertical cross section along B-B line of FIG. 2A during the manufacturing process (No. 16).

In such an embodiment, the sacrificial film 36 has been left on the polycrystalline silicon layer 8, however in this embodiment, after etching back the upper surface of the element isolating-insulating film 5, the sacrificial film 36, for example, is removed from the top of the polycrystalline silicon layer 8 by a wet-etching treatment (see FIG. 30A and FIG. 30B). At that time, as shown in FIG. 31, the sacrificial film 36 is also removed from the top of the polycrystalline silicon layer 8 of the peripheral circuit region P.

Next, the interelectrode insulating film 7 is formed. In this case, the interelectrode insulating film makes direct contact with the upper surface of the polycrystalline silicon layer 8 in the memory cell region M (see FIG. 32A and FIG. 32B). Next, the sacrificial film 37 is formed on the interelectrode insulating film 7 (see FIG. 33A and FIG. 333), and the sacrificial film 37 is etched back (see FIG. 34A and FIG. 34B) to form the nitride film 7a for film thickness compensation (see FIG. 35A and FIG. 35B). Thereafter, the manufacturing processes are the same as those of the first embodiment.

FIG. 29 shows a final structure of the transistor Tp with a high withstand voltage of the peripheral circuit region P produced by this manufacturing process. Utilizing the structure of the gate electrode PG of the peripheral circuit region P, a capacitor is formed, and the peripheral structure of the interelectrode insulating film 27 is used as a capacitor capacitance.

As shown in the first embodiment, if the cavity AGa is formed between the upper surface of the polycrystalline silicon layer 28 and the interelectrode insulating film 27 and the distance (interelectrode insulating film 27+cavity AGa) between the polycrystalline silicon layer 28 and the control electrode CG is increased, the effective capacity Cz is decreased, where $Cz=\in \times (S/d)$ (here, Cz represents a capacitance, $\in$ represents the dielectric constant, S represents the surface area, and d represents the film thickness of the insulating film). For this reason, to secure the required capacitance of the capacitor, the area of the capacitor and the area of chips of the NAND type flash memory device are likely to be increased.

On the contrary, according to this embodiment, in the peripheral circuit region P, as shown in FIG. 29, no cavity AGa is formed between the upper surface of the polycrystalline silicon layer 28 and the interelectrode insulating film 27. Therefore, the effective film thickness of the interelectrode insulating film 27 is not increased. Consequently, when a capacitor is formed in the peripheral circuit region P and the interelectrode insulating film 27 is used for the capacitance of the capacitor, an increase in the area of the capacitor and chips of the NAND type flash memory device is not necessary.

Embodiment 3

Figure 36B:
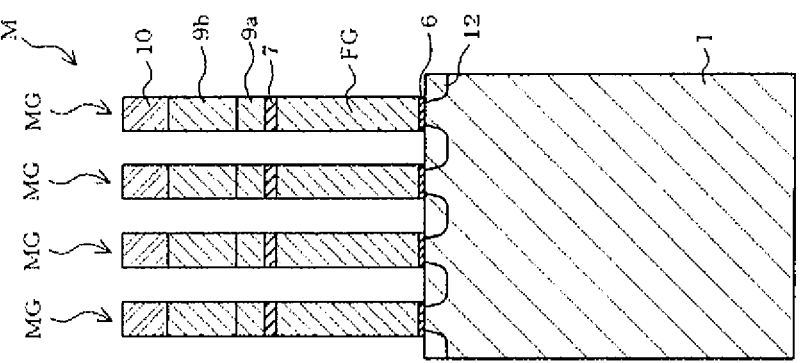
FIGS. 36A and 36B are vertical cross sections showing the main parts in a memory cell region of a third embodiment (FIG. 36A is a diagram corresponding to FIG. 3A, and FIG. 36B is a diagram corresponding to FIG. 3B).
Figure 36A:
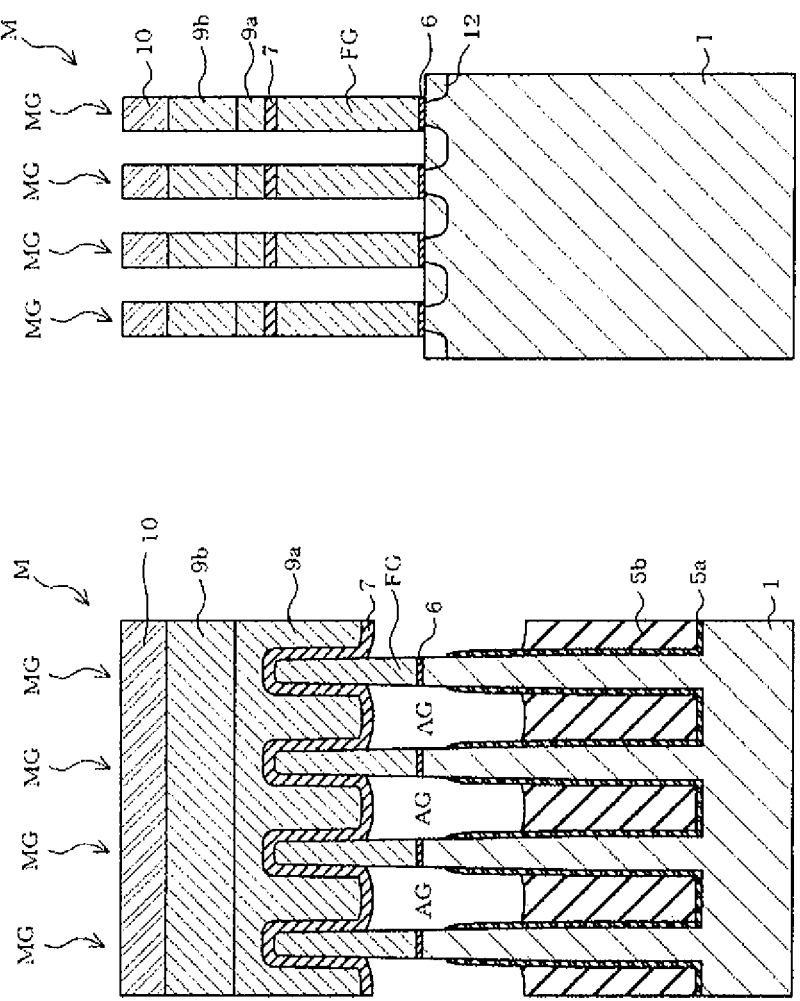
Figure 37A:
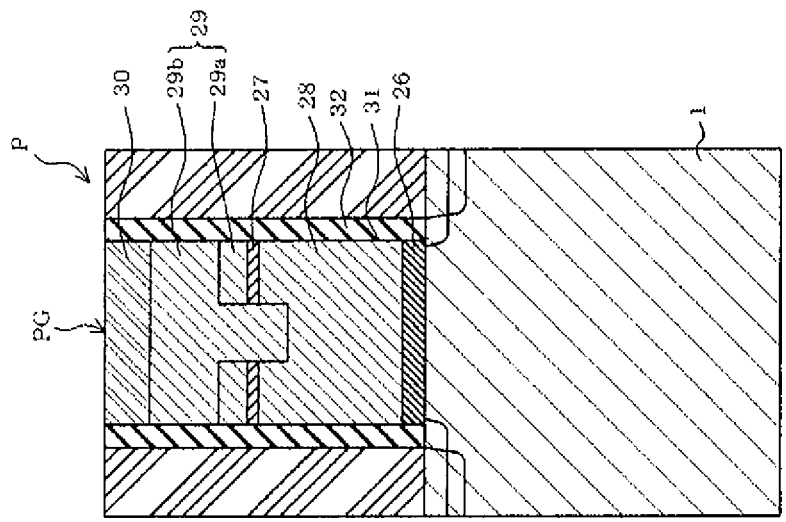
FIGS. 37A and 37B are vertical cross sections showing the main parts in a peripheral circuit region (FIG. 37A is a diagram corresponding to FIG. 5A, and FIG. 37B is a diagram corresponding to FIG. 5B).
Figure 37B:
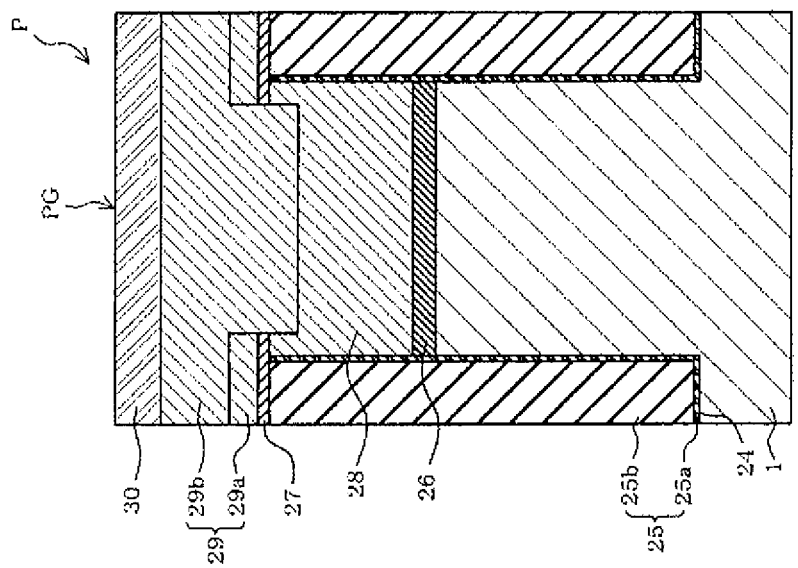
Figure 40B:
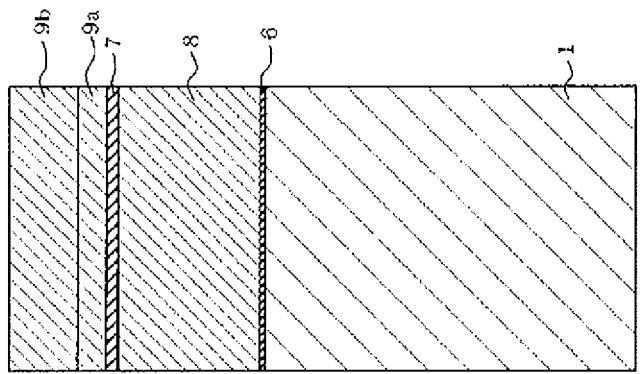
FIG. 40B is a schematic vertical cross section along B-B line of FIG. 2A during the manufacturing process (No. 18).
Figure 40A:
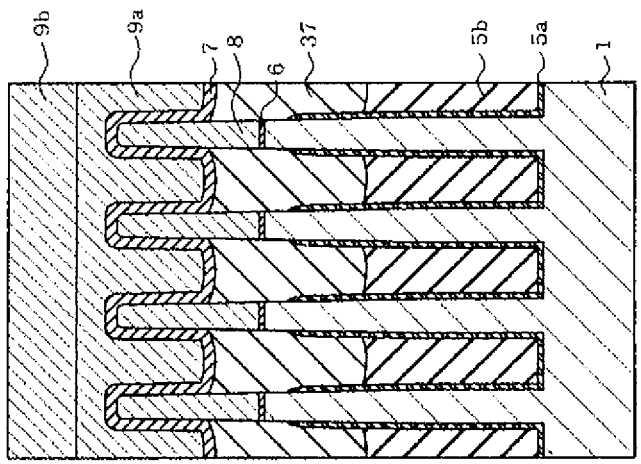
FIG. 40A is a schematic vertical cross section along A-A line of FIG. 2A during the manufacturing process (No. 18)

FIG. 36A to FIG. 40B show a third embodiment. The same symbols will be given to the same or similar constitutions as those of the first or second embodiment, and their explanation will be omitted. FIG. 36A and FIG. 36B are cross sections along A-A line and B-B line of FIG. 2A in the memory cell region M; FIG. 37A and FIG. 37B are cross sections along C-C line and D-D line of FIG. 2B in the peripheral circuit region P. This third embodiment, as shown in FIG. 36A and FIG. 36B, is one in which the interelectrode insulating film 7 is formed higher than the upper surface of the tunnel insulating film 6. Here, the peripheral circuit region P has a structure similar to that of the second embodiment as shown in FIGS. 37A and 37B.

In the memory cell region M, after passing through the manufacturing stages shown in FIG. 30A and FIG. 30B, the sacrificial film 37 is deposited and etched back (see FIG. 38A and FIG. 38B), the interelectrode insulating film 7 is formed (see FIG. 39A and FIG. 39B), the polycrystalline silicon layers 9a and 9h are deposited (see FIG. 40A and FIG. 40B), a gate processing treatment is applied, and the sacrificial film 37 is removed.

At that time, since the interelectrode insulating film 7 is formed after forming the sacrificial film 37, the lowermost end of the interelectrode insulating film 7 can be positioned higher than the upper surface of the tunnel insulating film 6. For this reason, even if the interelectrode insulating film 7 is formed relatively thick, the width of the air gap AG is not affected. With the formation of the interelectrode insulating film 7 after the formation of the sacrificial film 37, the interelectrode insulating film can be formed without newly depositing the nitride film 7a for film thickness compensation shown in the other embodiments on the interelectrode insulating film 7, thus being able to guarantee the characteristics of the interelectrode insulating film 7.

The other structures and manufacturing processes are similar to those of the second embodiment. Therefore, in the structure of the third embodiment, the air gap AG can also be formed between the adjacent element regions 3 (channels), obtaining operation effects nearly the same as those of the second embodiment. In particular, since no cavity AGa is present in the upper part of the polycrystalline silicon layer 28 of the peripheral circuit region P, similar to the other embodiments, if the interelectrode insulating film 27 is used as a capacitor capacitance, an increase in chip area can be avoided.

Without being limited to the embodiments, for example, the following modifications and expansions are possible. Although the present disclosure has been applied to the NAND type flash memory device, the present disclosure can be applied to other EEPROM, for example, AND type non-volatile semiconductor storage devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
a semiconductor substrate having an element isolation groove;
a plurality of memory cells, each including a first gate electrode having a charge storage layer, an interelectrode insulating film, and a control electrode, the first gate electrode being on the semiconductor substrate via a tunnel insulating film, and the interelectrode insulating film being between the charge storage layer and the control electrode; and
an insulating film in the element isolation groove, the insulating film having an upper surface that is lower than an upper surface of the semiconductor substrate,
wherein the interelectrode insulating film and the control electrode of the first gate electrode are over the insulating film, and the interelectrode insulating film includes a first portion directly on the insulating film and a second portion over the charge storage layer that is separated from the charge storage layer by a cavity.

2. The nonvolatile semiconductor storage device according to claim 1, further comprising:
a peripheral transistor including a gate electrode having a first electrode, an interelectrode insulating film, and a second electrode that is on the semiconductor substrate via a gate insulating film, wherein the first electrode is the same layer as the charge storage layer of the memory cells and the second electrode is the same layer as the control electrode of the memory cells.

3. The nonvolatile semiconductor storage device according to claim 2, wherein the interelectrode insulating film of the peripheral transistor is formed directly on an insulating film disposed in an element isolation groove at the side of the second gate electrode, and the second electrode is directly on the interelectrode insulating film of the peripheral transistor.

4. The nonvolatile semiconductor storage device according to claim 3, wherein the interelectrode insulating film of the peripheral transistor comprises an oxide film and has a portion facing a gap.

5. The nonvolatile semiconductor storage device according to claim 4, wherein the interelectrode insulating film of the peripheral transistor is provided with a nitride film that is formed by a plasma nitrification treatment.

6. A nonvolatile semiconductor storage device, comprising:
a semiconductor substrate having an element isolation groove;
a plurality of memory cells, each including a gate electrode having a charge storage layer, an interelectrode insulating film, and a control electrode, the gate electrode being on the semiconductor substrate via a tunnel insulating film, and the interelectrode insulating film being between the charge storage layer and the control electrode; and
an insulating film in the element isolation groove,
wherein the interelectrode insulating film and the control electrode of the gate electrode are over the element isolation groove, and the interelectrode insulating film includes a portion directly on the insulating film between the control electrode and the insulating film that is separated from the control electrode by a gap.

7. The nonvolatile semiconductor storage device according to claim 6, wherein an upper surface of the insulating film is lower than an upper surface of the semiconductor substrate.

8. The nonvolatile semiconductor storage device according to claim 6, wherein the interelectrode insulating film has a portion above the charge storage layer that is separated from the charge storage layer by a cavity.

9. The nonvolatile semiconductor storage device according to claim 6, further comprising:
a peripheral transistor including a gate electrode having a first electrode, an interelectrode insulating film, and a second electrode that is on the semiconductor substrate via a gate insulating film, wherein the first electrode is the same layer as the charge storage layer of the memory cells and the second electrode is same layer as the control electrode of the memory cells.

10. The nonvolatile semiconductor storage device according to claim 9, wherein the interelectrode insulating film of the peripheral transistor is directly on an insulating film disposed in an element isolation groove at the side of the second gate electrode, and the second electrode is directly on the interelectrode insulating film of the peripheral transistor.

11. The nonvolatile semiconductor storage device according to claim 10, wherein the interelectrode insulating film of the peripheral transistor comprises an oxide film and has a portion facing the gap.

12. The nonvolatile semiconductor storage device according to claim 11, wherein the interelectrode insulating film of the peripheral transistor is provided with a nitride film that is formed by a plasma nitrification treatment.

\* \* \* \* \*